US006960415B2

(12) United States Patent
Shiode

(10) Patent No.: US 6,960,415 B2
(45) Date of Patent: Nov. 1, 2005

(54) ABERRATION MEASURING METHOD AND PROJECTION EXPOSURE APPARATUS

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 248 days.

(21) Appl. No.: 10/260,278

(22) Filed: Oct. 1, 2002

(65) Prior Publication Data

US 2003/0091913 A1 May 15, 2003

(30) Foreign Application Priority Data

Oct. 1, 2001 (JP) ........................................ 2001-305585

(51) Int. Cl.⁷ ............................ G03F 9/00; G03C 5/00; G03B 27/68; G03B 27/42
(52) U.S. Cl. ........................... 430/30; 430/311; 355/52; 355/53; 355/67; 355/77; 356/124
(58) Field of Search ..................... 430/30, 311; 355/52, 355/53, 67, 77; 356/124

(56) References Cited

U.S. PATENT DOCUMENTS

| 5,828,455 A | 10/1998 | Smith et al. ................. 356/354 |
| 5,978,085 A | 11/1999 | Smith et al. ................. 356/354 |
| 6,130,747 A | 10/2000 | Nomura et al. ........... 356/239.2 |
| 6,368,763 B2 * | 4/2002 | Dirksen et al. ................ 430/30 |
| 6,741,327 B2 * | 5/2004 | Nomura et al. ................ 355/52 |
| 6,787,789 B2 * | 9/2004 | Van Der Laan ............. 250/548 |
| 2003/0133099 A1 | 7/2003 | Shiode ......................... 356/124 |
| 2003/0197865 A1 | 10/2003 | Shiode ......................... 356/399 |
| 2004/0157136 A1 * | 8/2004 | Chandhok et al. .............. 430/5 |

FOREIGN PATENT DOCUMENTS

| JP | 6-120116 | 4/1994 |
| JP | 11-237310 | 8/1999 |
| JP | 11-340653 | 11/1999 |
| JP | 2000-266640 | 9/2000 |
| JP | 2001-264582 | 9/2001 |
| WO | WO 00/31592 | 6/2000 |

\* cited by examiner

*Primary Examiner*—Christopher G. Young
(74) *Attorney, Agent, or Firm*—Fitzpatrick, Cella, Harper & Scinto

(57) ABSTRACT

A method of measuring aberration of a projection optical system. The method includes the steps of imaging a test pattern through the projection optical system, and measuring a potential deviation amount of the image of the test pattern and measuring aberration of the project optical system on the basis of the positional deviation amount. The measuring step includes a process of determining a coefficient of a particular Zernike term and a process of changing a position or a shape of a region on a pupil plane of the projection optical system before light from the test pattern passes therethrough, in accordance with the particular Zernike term.

9 Claims, 27 Drawing Sheets

| INSPECTION ITEM | APERTURE STOP ROTATIONAL POSITION (IMAGE) | | | | EVALUATION QUANTITY | DEFINITION EQUATION |
|---|---|---|---|---|---|---|
| LOWER ORDER $2\theta$ | d1 | d2 | d3 | d4 | C5① | $\{SV(d1-d2)-SH(d3-d4)\}/Zer5$ |
| | e1 | e2 | e3 | e4 | C5② | $-\{SH(e1-e2)-SV(e1-e2)+SH(e3-e4)+SV(e3-e4)\}/Zer5$ |
| | d1' | d2' | d3' | d4' | C6① | $\{SV(d1'-d2')+SH(d1'-d2')+SV(d3'-d4')-SH(d3'-d4')\}/Zer6$ |
| | e1' | e2' | e3' | e4' | C6② | $\{SH(e1'-e2')+SV(e3'-e4')\}/Zer6$ |
| LOWER ORDER SA | f1 f1' f1" | f2 f2' f2" | f3 f3' f3" | f4 f4' f4" | C4(Z) | $\{\sqrt{2}*[SV(f1-f2)+SH(f3-f4)]+[SH(f5-f6)+SV(f5-f6)]+[SH(f7-f8)-SV(f7-f8)]\}/2/Zer4$ |
| | f5 f5' | f6 f6' | f7 f7' | f8 f8' | C9 | ditto |
| | | | | | C15 | ditto |
| LOWER ORDER $\theta, 3\theta$ | g1 | g2 | g3 | g4 | C7 | $\{SV(g1-g2)+SH(g3-g4)\}/Zer7$ |
| | | | | | C8 | $\{-SH(g1-g2)+SV(g3-g4)\}/Zer8$ |
| | | | | | C10 | $\{SV(g1-g2)-SH(g3-g4)\}/Zer10$ |
| | | | | | C11 | $\{SH(g1-g2)+SV(g3-g4)\}/Zer11$ |

FIG. 10

ABERRATION MEASURING METHOD AND PROJECTION EXPOSURE APPARATUS

FIELD OF THE INVENTION AND RELATED ART

This invention relates to an aberration measuring method and a projection exposure apparatus for which aberration of a projection optical system is to be measured by that method. The invention is suitably usable, for example, for measurement and correction of wavefront aberration or focus of a projection optical system, for example, in a projection exposure apparatus which is used in a lithographic process in the manufacture of semiconductor devices, liquid crystal display devices, or thin film magnetic heads, for example.

The manufacture of semiconductor devices, liquid crystal display devices, or thin film magnetic heads, for example, through a lithographic process, uses a projection exposure apparatus for imaging an image of a pattern of a photomask or reticle (hereinafter "reticle") onto a photosensitive substrate through a projection optical system. Currently, the influence of aberration of the projection optical system (e.g., a lens) of such a projection exposure apparatus raises serious problems, and the importance of aberration measurement in projection optical systems has increased.

Various measurement methods have been proposed in this connection and, in practice, aberration measurement is carried out in regard to spherical aberration, image plane (curvature), astigmatism, coma and wavefront aberration, for example. Among these aberrations, the wavefront aberration is the very significant aberration, and usually it is measured by use of an interferometer, in lens manufacturing factories. However, inside the major assembly of projection exposure apparatuses, available spaces are quite limited and, therefore, measurement using an interferometer is practically difficult to accomplish. In consideration of this, attempts have been made to develop a method for measuring wavefront aberration without an interferometer.

Generally, by approximating wavefront aberration on the basis of a Zernike polynomial, or the like, typical aberrations such as coma, astigmatism, image plane, and spherical aberration, which are factors of the polynomial, can be calculated. Also, the results of simulations made to an actual device pattern by using Zernike coefficients are practically and frequently fed back to a mask, a process, or an exposure apparatus. Therefore, measuring the wavefront aberration inside the major assembly of an exposure apparatus to thereby measure Zernike coefficients at a high precision, is strongly desired.

Wavefront aberration measuring methods are proposed in U.S. Pat. Nos. 5,828,455 and 5,978,085, for example. In the measuring methods proposed there, a grid-like pattern is provided on a pattern surface (lower surface) of a glass of a reticle, and a pinhole is provided right below the center of the grid-like pattern with a small spacing kept from it. Further, on a non-pattern surface (upper surface) of the glass of the reticle, there is a special reticle having a convex lens placed just above the center of the grid-like pattern. Due to the aforementioned convex lens, illumination light emitted from an illumination system of an exposure apparatus is transformed into a light flux having a wide illumination angle σ (sigma) satisfying $\sigma \leq 1$ with which the grating pattern below it is illuminated. The light passed through the grid pattern goes through the pinhole below it.

At this time, the light that can pass through the pinhole is limited only to such light rays as having an angle connecting each point on the grid pattern and the aforementioned pinhole. Therefore, light rays emitted from respective points on the grid pattern advance in the form of plural lights having mutually different angles (with respect to the optical axis). These light beams having mutually different angles arrive at mutually different positions upon a pupil plane of the projection optical system and, while being influenced by the wavefront aberration of the projection optical system, they are imaged upon a wafer surface. Here, each point of the grid pattern being imaged on the wafer surface has been influenced by the wavefront aberration (phase) differently. Namely, since a light ray to be imaged advances in a direction of a normal to the wavefront, each point being imaged shifts from an idealistic position by an amount corresponding to the tilt of the wavefront. In consideration of this, by measuring deviations, from an idealistic grid, of each imaged point of the grid pattern, tilts of the wavefront at each point on the pupil plane are obtained and, by using various mathematical techniques, the wavefront can be calculated.

Zernike coefficients are obtainable as follows. By using an interferometer as described above, phase differences of very small areas which are uniformly distributed over the whole pupil plane of the projection optical system are measured and, based on it, the wavefront aberration is measured. Then, approximation is made to this wavefront aberration on the basis of a Zernike polynomial, and Zernike coefficients are calculated. Since the Zernike polynomial is an orthogonal polynomial, the application under the above-described condition is idealistic, and it can be said as a best measurement method which assures an absolute precision.

As regards a method of measuring wavefront aberration (Zernike coefficient) inside the major assembly of an exposure apparatus as shown in the aforementioned U.S. patents, there are two ways, that is, one in which the phase difference (wavefront) is calculated directly from a positional deviation of a pattern on an image plane, and one in which a differential coefficient (slope) of the wavefront is first calculated similarly on the basis of a positional deviation of a pattern upon an image plane and then the phase wavefront is reproduced on the basis of the differential wavefront. In any of these methods, approximation of a Zernike polynomial is possible. However, both of these methods need the use of many measurement points, enough to satisfy the orthogonal condition sufficiently. That is, if the orthogonal condition is not satisfied, it means that, since the Zernike terms interfere with each other, the value of each Zernike coefficient is variable in dependence upon to what order the calculation is going to be made to the Zernike terms or which term is not going to be calculated.

However, the methods disclosed in the aforementioned U.S. patents involve problems in relation to image height and measurement time. The problem of image height is that: since a group of marks (measurement marks) to be measured needs a region of a certain extent, if the number of measurement points on the pupil plane increases, it causes enlargement of the number of measurement marks and, therefore, the extension of the mark group region expands possibly beyond the range that can be regarded as one image height. Although it may be contemplated to diminish the size of the mark itself to make the whole mark group region smaller, it is difficult to accomplish this with respect to the precision of a measuring tool, or because this might cause a fundamental problem related to the principle of the measurement method itself.

The problem of image height can be avoided by moving the mask and the imaging plane along a perpendicular to the optical axis. However, since the number of exposures to be performed also increases by an amount corresponding to the number of measurement marks to be measured, when measured values are taken in combination to reproduce the wavefront, the precision is influenced by a focus error (or movement error in some cases). Further, clearly, this makes the problem of measurement time more serious.

The problem of measurement time is such that an increase in the number of measurement points inevitably results in prolongation of the time required for the measurement. This problem is involved in all cases where a large number of measurement marks are set on a mask.

SUMMARY OF THE INVENTION

It is an object of the present invention to provide an aberration measuring method and a projection exposure apparatus for which the method can be used, wherein a Zernike coefficient can be detected relatively easily such that aberration or focus position, or the like, of an optical system can be measured relatively easily.

The present invention defines "Zernike sensitivity" as representing an amount of a change in positional deviation of a test pattern image with respect to an amount of change in a certain Zernike coefficient. For example, in relation to each term (Zernike term) of a Zernike polynomial, the amount of change in positional deviation of an image of a test pattern, produced by point light source illumination or small-region light source illumination, with respect to the amount of change in that Zernike coefficient, that is, the Zernike sensitivity, may be stored as a database, with respect to all effective point light source positions or all effective small-region light source positions. Then, from this database, such a combination of point light sources or small-region light sources that enables measurement and extraction of a particular Zernike term, among the terms described above, that is, the effective light source, may be determined.

Specifically, in accordance with an aspect of the present invention, there is provided a method of measuring aberration of a projection optical system, comprising the steps of: imaging a test pattern through the projection optical system; and measuring a positional deviation amount of the image of the test pattern (from a predetermined position) and measuring aberration of the projection optical system on the basis of the positional deviation amount, wherein a region at a pupil of the projection optical system through which light from the test pattern passes is restricted so as to provide a relation of 1:1 between the positional deviation of the test pattern image and a coefficient of a particular Zernike term.

In accordance with another aspect of the present invention, there is provided a method of measuring aberration of a projection optical system, comprising the steps of: imaging a test pattern through the projection optical system; and measuring a positional deviation amount of the image of the test pattern (from a predetermined position) and measuring aberration of the projection optical system on the basis of the positional deviation amount, wherein a region at a pupil of the projection optical system through which light from the test pattern passes is restricted so that the positional deviation of the test pattern image mainly depends on a coefficient of a particular Zernike coefficient.

As regards the restriction of the region at the pupil of the projection optical system through which light from the test pattern passes, once the effective light source is determined, it can be accomplished on the basis of an aperture stop of an illumination system of illuminating the test pattern or a pupil plane filter of the projection optical system. The aperture stop of the illumination system serves to define the effective light source, and thus, an effective light source shape (distribution) analogous to the aperture shape of that stop is formed. As regards the aperture stop of this illumination system, a test pattern (mark) is provided having lines and spaces effective to ensure that mainly zeroth order diffraction light passes through the pupil plane of the projection optical system while higher order diffraction light does not pass therethrough and, thus, does not reach the image plane.

A projection exposure apparatus according to the present invention may be a projection exposure apparatus having an illumination system for illuminating a reticle having a test pattern such as described above, with light from a desired effective light source.

A device manufacturing method according to the present invention includes a step for exposing a substrate with a device pattern by use of a projection exposure apparatus described above, and a step of developing the exposed substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 10 is a schematic view for explaining measurement processes according to the present invention.

DESCRIPTION OF THE PREFERRED EMBODIMENTS

Figure 1:
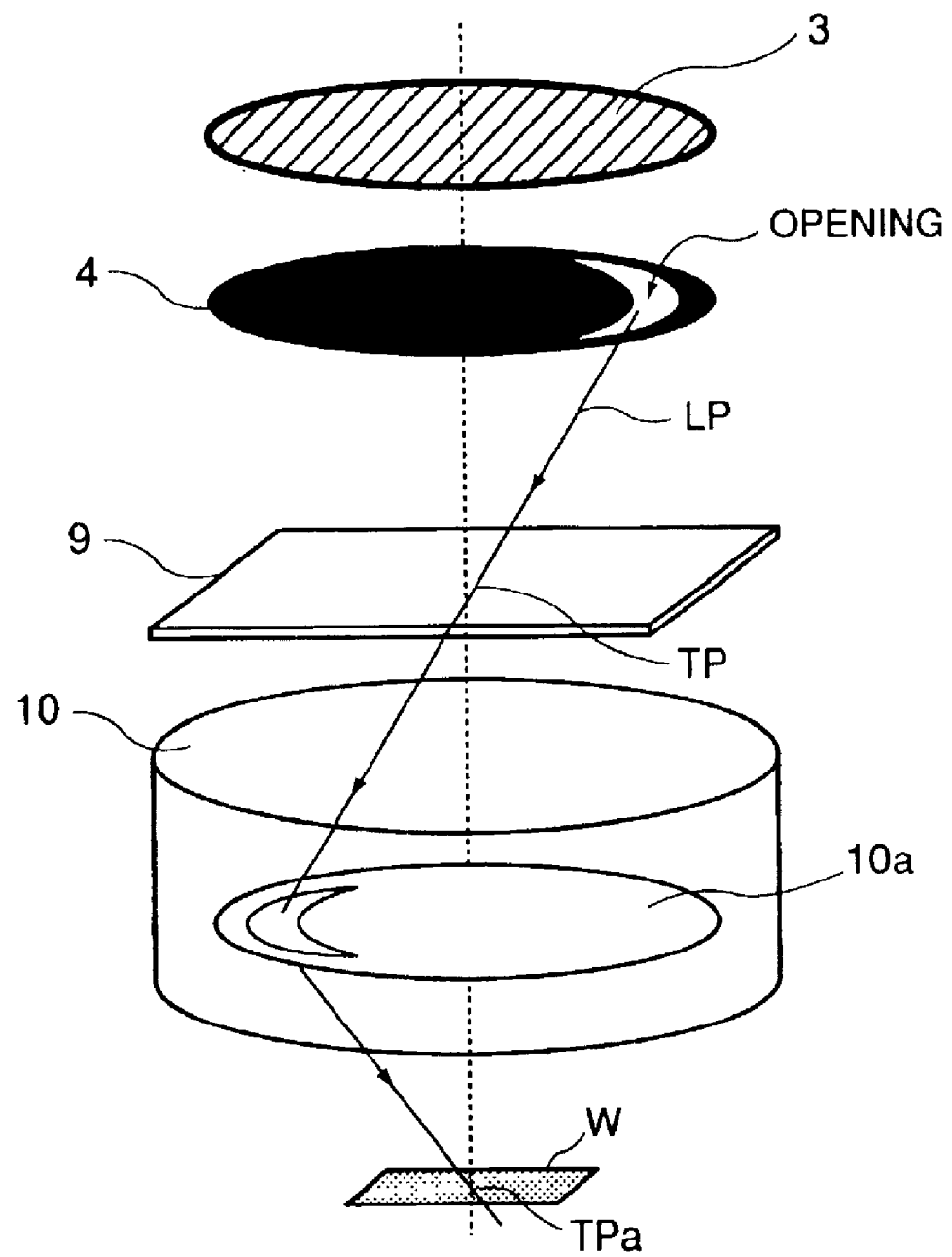
FIG. 1 is a fragmentary and schematic view of a main portion of a projection exposure apparatus according to the present invention.

Preferred embodiments of the present invention will be described with reference to the attached drawings.

In the present invention, an effective light source and a test pattern are optimized so as to determine the region for light which is going to pass through a pupil plane of a projection optical system, with respect to a particular Zernike term (coefficient) and, by measuring a positional deviation of the test pattern formed by that light, the Zernike coefficient is calculated.

Before describing preferred embodiments of the present invention, how to obtain Zernike coefficients will be explained.

Several problems have been pointed out in regard to the method of calculating Zernike coefficients by measuring positional deviations of plural pattern images formed through a projection lens. Since the Zernike polynomial is an orthogonal polynomial, Zernike terms (coefficients) themselves do not affect each other. Namely, Zernike coefficients can be calculated independently of each other and, therefore, they can be calculated infinitely with the addition of higher order terms. However, in order to take this advantage, the aggregation of discrete measurement points must satisfy the orthogonal condition. This applies large limitations in measurement. In consideration of it, a method which does not rely on the orthogonality will be explained below.

Those terms in the Zernike polynomial that may actually affect the imaging performance of a projection optical lens are low-order terms. Thus, even if device miniaturization goes on and it may become necessary to take into account the influence of high-order terms, first to thirty-sixth Zernike terms shown in Table 1, below, and discussed generally at present, will be sufficient. Although there may not be a specific reason to limit them to the first to thirty-sixth terms, it will be sufficient to take into consideration those high-order terms in which their high-order components can be regarded as being sufficiently small as compared with Zernike low-order components of a practical projection optical system. In other words, in the measurement in which an approximation calculation is to be carried out without an orthogonal system, approximation calculation should be performed only with respect to those high-order terms which would adversely affect coefficients of low-order terms in questions.

TABLE 1

| | R | | | | |
|---|---|---|---|---|---|
| | m | n | Wrms/1 | $R_n^m(r)$ | |
| C1 | 0 | 0 | 1 | 1 | |
| C2 | 1 | 1 | 0.5 | r | Cosθ DistX |
| C3 | 1 | 1 | 0.5 | | Sinθ DistY |
| C4 | 0 | 2 | 0.5774 | $2r^2 - 1$ | Defocus |
| C5 | 2 | 2 | 0.4082 | $r^2$ | Cos2 As-SM |
| C6 | 2 | 2 | 0.4082 | | Sin2 AS-HV |

TABLE 1-continued

| | R | | | | |
|---|---|---|---|---|---|
| | m | n | Wrms/1 | $R_n^m(r)$ | |
| C7 | 1 | 3 | 0.3536 | $3r^3 - 2r$ | Cosθ ComaX |
| C8 | 1 | 3 | 0.3536 | | Sinθ ComaY |
| C9 | 0 | 4 | 0.4472 | $6r^4 - 6r^2 + 1$ | SA |
| C10 | 3 | 3 | 0.3536 | $r^3$ | Cos3 3leaf- |
| C11 | 3 | 3 | 0.3536 | | Sin3 |
| C12 | 2 | 4 | 0.3162 | $4r^4 - 3r^2$ | Cos2 As-SM |
| C13 | 2 | 4 | 0.3162 | | Sin2 AS-HV |
| C14 | 1 | 5 | 0.2887 | $10r^5 - 12r^3 + 3r$ | Cosθ ComaX |
| C15 | 1 | 5 | 0.2887 | | Sinθ ComaY |
| C16 | 0 | 6 | 0.378 | $20r^6 - 30r^4 + 12r^2 - 1$ | SA |
| C17 | 4 | 4 | 0.3162 | $r^4$ | Cos4 |
| C18 | 4 | 4 | 0.3162 | | Sin4 |
| C19 | 3 | 5 | 0.2887 | $5r^5 - 4r^3$ | Cos3 3leaf- |
| C20 | 3 | 5 | 0.2887 | | Sin3 |
| C21 | 2 | 6 | 0.2673 | $15r^6 - 20r^4 + 6r^2$ | Cos2 As-SM |
| C22 | 2 | 6 | 0.2673 | | Sin2 AS-HV |
| C23 | 1 | 7 | 0.25 | $35r^7 - 60r^5 + 30r^3 - 4r$ | Cosθ ComaX |
| C24 | 1 | 7 | 0.25 | | Sinθ ComaY |
| C25 | 0 | 8 | 0.3333 | $70r^8 - 140r^6 + 90r^4 - 20r^2 + 1$ | SA |
| C26 | 5 | 5 | 0.2887 | $r^5$ | Cos5 |
| C27 | 5 | 5 | 0.2887 | | Sin5 |
| C28 | 4 | 6 | 0.2673 | $6r^6 - 5r^4$ | Cos4 |
| C29 | 4 | 6 | 0.2673 | | Sin4 |
| C30 | 3 | 7 | 0.25 | $21r^7 - 30r^5 + 10r^3$ | Cos3 3leaf- |
| C31 | 3 | 7 | 0.25 | | Sin3 |
| C32 | 2 | 8 | 0.2357 | $56r^8 - 105r^6 + 60r^4 - 10r^2$ | Cos2 As-SM |
| C33 | 2 | 8 | 0.2357 | | Sin2 AS-HV |
| C34 | 1 | 9 | 0.2236 | $126r^9 - 280r^7 + 210r^5 - $ | Cosθ comaX |
| C35 | 1 | 9 | 0.2236 | | Sinθ comaY |
| C36 | 0 | 10 | 0.3015 | $252r^{10} - 630r^8 + 560r^6 - 210r^4 + 30r^2 - 1$ | SA |
| (C49) | 0 | 12 | 0.2774 | | SA |

$$\begin{pmatrix} S_1 \\ S_2 \\ \cdot \\ \cdot \\ \cdot \\ S_q \end{pmatrix} = \begin{pmatrix} Z_1(r1, \dot{e}1) & Z_2(r1, \dot{e}1) & \ldots & Z_{36}(r1, \dot{e}1) \\ Z_1(r2, \dot{e}2) & Z_2(r2, \dot{e}2) & \ldots & Z_{36}(r2, \dot{e}2) \\ \cdot & \cdot & \ldots & \cdot \\ \cdot & \cdot & \ldots & \cdot \\ \cdot & \cdot & \ldots & \cdot \\ Z_1(rq, \dot{e}q) & Z_2(rq, \dot{e}q) & \ldots & Z_{36}(rq, q) \end{pmatrix} \cdot \begin{pmatrix} C_1 \\ C_2 \\ \cdot \\ \cdot \\ \cdot \\ C_{36} \end{pmatrix} \quad (1)$$

or alternatively, $$\bar{s} = Z \cdot \bar{c}$$

wherein $S_i$ is the positional deviation from an idealistic position where i=1 to q, (r,θ) is the pupil polar coordinate, $Z_j$ is the Zernike term or Zernike derivative term, where j is 1 to 36, and $C_j$ is the Zernike coefficient.

In order to obtain Zernike's first to thirty-sixth terms representing the wavefront of the projection lens, the above-described determinant (1) should be solved. Practically, a measured value Si contains an error. Furthermore, there may be a gap in data and also, due to a difference in measurement method or any change in measurement condition (design), the sampling method for the points (ri, θi) (i=1 to q), that is, measurement points and measurement locations may differ. The solution $C_j$ is influenced by them.

$$\bar{s}' = Z' \cdot \bar{c}'$$

It is seen from the determinant that there occur changes of matrix Z→Z' and vector S→S' and, as a consequence, different results are calculated out (vector c→c'). This problem can be said to be a common problem in the measuring methods described hereinbefore. In order to avoid this, the matrix Z should be fixed and, also, since the matrix Z does not satisfy the orthogonality condition, the measurement method itself desirably may have such a shape as that of a diagonal matrix in which a solution is determined definitely.

$$\begin{pmatrix} S_1 \\ S_2 \\ \cdot \\ \cdot \\ \cdot \\ S_q \end{pmatrix} = \begin{pmatrix} \lambda_1 & 0 & 0 & \ldots & 0 \\ 0 & \lambda_2 & 0 & \ldots & 0 \\ & & & & \\ & & & & \\ & & & & \\ 0 & 0 & 0 & \ldots & \lambda_{36} \end{pmatrix} \cdot \begin{pmatrix} C_1 \\ C_2 \\ \cdot \\ \cdot \\ \cdot \\ C_{36} \end{pmatrix}$$

Here, while taking a particular note only to line vectors $(\lambda_1, 0, 0, \ldots, 0)$ in the above-described diagonal matrix, optimization based on the following equations (2) will be considered.

$$\lambda_1 = \sum_k W_k \cdot Z_1(rk \cdot \vec{ek})$$

$$0 = \sum_k W_k \cdot Z_2(rk \cdot \vec{ek})$$

$$\cdot$$
$$\cdot$$
$$\cdot$$

$$0 = \sum_k W_k \cdot Z_{36}(rk, \vec{ek})$$

(2)

where W is the standardized weight coefficient, k is a measurement position on a pupil plane, and $Z(rk, \theta k)$ is the Zernike sensitivity.

In the above-described simultaneous equations (2), if the amount of change in positional deviation of an image, upon an imaging plane and at an arbitrary position k corresponding to the pupil coordinate of the projection lens to be measured (Zernike sensitivity), is predetected with respect to each Zernike term, then the equations (2) can be satisfied by optimizing the weight coefficient Wk and the pupil region k. Namely, once a measurement method that satisfies equations (2) is structured, then the positional deviation amount S1 of the image represents independently a Zernike coefficient of one term of the projection optical system to be measured.

$$Sx = \left[ \sum_k W_k \cdot Z_1(rk, \vec{e}) \sum_k W_k \cdot Z_2(rk, \vec{e}) \ldots \sum_k W_k \cdot Z_{36}(rk, \vec{e}) \right] \cdot \begin{bmatrix} C_1 \\ C_2 \\ \cdot \\ \cdot \\ \cdot \\ C_{36} \end{bmatrix}$$

As regards the other Zernike terms, similarly, by optimizing the weight coefficient Wk and the pupil region k, Zernike coefficients can be extracted independently. Therefore, by measuring Zernike coefficients under mutually different measurement conditions (weight coefficients Wk and pupil regions k), a measurement method in which Zernike terms are independent and do not interfere with each other is accomplished.

Here, the relationship between the positional deviation of an image and the Zernike sensitivity will be explained. The slope or phase difference of a wavefront can be expressed in terms of pupil position and Zernike coefficient. Thus, the positional deviation amount S1 of the image produced by them is linear with respect to the slope of the wavefront or phase difference thereof at the position (very small region) of the light passed through the pupil plane in the imaging, as shown by equation (3) below.

$$S1 = g \cdot Ci \cdot Zi(x1, y1) \quad (3)$$

where S1 is the positional deviation with respect to a pupil coordinate (x1, y1), g is a constant, Ci is the Zernike coefficient, and $Zi(x1, y1)$ is the Zernike sensitivity at the i-th term on the pupil position (x1, y1).

It is seen from equation (3) that if various light beams passed through different pupil positions are images, from the linearity, it follows that:

$$\begin{aligned} S_T &= \Sigma Wk \cdot Sk \\ &= \Sigma Wk \cdot \Sigma g \cdot Ci \cdot Zi(xk, yk) \\ &= g \Sigma Ci \Sigma Wk \cdot Zi(Xk, yk) \end{aligned} \quad (4)$$

It is seen from equation (4) that the image positional deviation corresponds to the sum of positional deviations Sk of each small pupil region, and that, with respect to the Zernike term i, it corresponds to what is obtainable by multiplying the sum of the Zernike sensitivities of each pupil position k by Zernike coefficients. In the present invention, the sum of Zernike sensitivities at each pupil position k is optimized.

By carrying out a Zernike coefficient measurement method based on the concept described above, problems related to the image height and absolute value resulting from the orthogonality condition can be solved. Further, generally, only one measured value is necessary for obtaining one coefficient. Therefore, the measurement time can be shortened significantly. Thus, the problem of measurement time can also be solved. Further, in a method in which a differential coefficient of the wavefront (differential wavefront or slope) is calculated from normally thinkable positional deviations and in which, by reproducing the phase wavefront from this differential wavefront, Zernike polynomial approximation is carried out, since it is unnecessary that the polynomial is orthogonal, the approximation can be done directly by the Zernike polynomial being differentiated with respect to the differential wavefront and Zernike coefficients can be obtained thereby.

In the present invention, as described above, the Zernike sensitivity in the image positional deviation corresponding to the pupil position of the projection lens is prepared as a database, through calculations or experiments. The pupil region of the projection optical system and weight inside that region are optimized with respect to particular aberration, such that a measurement system in which light can pass through only the pupil region of the projection optical system is structured. Based on this, the positional deviation of an image formed by that light is measured, by which an aberration amount in relation to the particular aberration described above is measured. On the basis of the measurement result, the aberration of the optical system is corrected by correcting means.

Now, a description will be made of a case wherein an embodiment of an aberration measuring method according to the present invention is applied to a projection exposure apparatus for projecting a circuit pattern onto a photosensitive substrate (wafer) through a projection optical system, so as to detect Zernike coefficients of the projection optical system. In this embodiment, as a prerequisite condition, Zernike terms of 1–36 only are treated.

In the present invention, as described above, an aperture stop (pupil filter) having an optimum shape and optimum transmissivity is provided on a pupil plane of a projection optical system (projection lens) by which measurement of a particular Zernike coefficient is enabled. However, due to spatial limitation inside a lens barrel structure or because of a necessity of environmental control, or the like, if it is not easy to provide special aperture stops in relation to various Zernike terms upon the pupil plane of the projection lens, a structure shown in an embodiment to be described below can be employed.

FIG. 1 is a fragmentary schematic view of a main portion of a projection exposure apparatus of this embodiment. In FIG. 1, a pattern or pattern group (test pattern) TP is formed on a reticle 9, and illumination light having a principal ray LP is projected on this test pattern TP through an illumination stop 4 which is provided at an effective light source plane of an illumination optical system. The test pattern TP on the reticle 9 is imaged by a projection lens 10 at a photosensitive substrate W side thereof. Then, the position of an aerial image of the test pattern or a pattern image TPa as transferred onto the photosensitive substrate W is measured. The test pattern TP may be provided on a separate reference plate, not on the reticle 9. By measuring the position of the aerial image or a transferred pattern image TPa, the aberration of the projection optical system 10 is measured.

The test pattern described above may be a periodic pattern having an approximately regular pitch (intervals) in lines or spaces, as proposed in Japanese Patent Application, Application No. 2001-264582, filed in Japan in the name of the assignee of the subject application. In this pattern, the widths of spaces through which light can pass gradually decrease from the center to the periphery of the periodic pattern. A different pattern having a similar function may be used.

The pattern such as described above is effective to reduce diffraction light and to ensure that, on the pupil plane 10a of the projection lens 10, a light intensity distribution of a shape approximately close to the aperture shape of the aperture stop 4 (for illumination) is produced mainly with zeroth order light from that pattern. Additionally, the light intensity distribution of the aerial image or transferred pattern image TPa being imaged through the projection lens 10 can be regarded as being a single large pattern with small distortion wherein adjacent lines are not resolvable. This aerial image or pattern image TPa transferred to the photosensitive substrate is measured, in terms of positional deviation amounts from a certain reference position. The aperture shape of the aforementioned illumination aperture stop 4 has been optimized with respect to a particular Zernike term, from the database for Zernike sensitivity to a positional deviation amount having been obtained by calculation in advance in relation to each position on the pupil plane of the projection lens 10.

Namely, the effective light source distribution of the illumination system is set so as to assure that the positional deviation amount of the test pattern image from a predetermined position mainly depends on one coefficient of a particular Zernike term in the Zernike polynomial and, by doing this, passing through the pupil of the projection lens, can be restricted to a predetermined region.

Particularly, the effective light source distribution of the illumination system may be set so as to assure that the positional deviation amount of the test pattern image from a predetermined position and a coefficient of a particular Zernike term in the Zernike polynomial are placed in a relationship of 1:1 and, by doing this, the passage region within the pupil for the light, passing through the pupil of the projection lens, can be restricted to a predetermined region.

In this embodiment, in the state shown in FIG. 1, through an illumination optical system having a stop 4 with an optimized aperture, illumination light having a principal ray LP is projected onto the test pattern TP formed on the reticle 9. The test pattern TP on the reticle 9 is then imaged, and an aerial image thereof is measured or, alternatively, a corresponding pattern image TPa is transferred to a photosensitive substrate W. Subsequently, the illumination aperture stop 4 is rotated or, alternatively, it is replaced by another aperture stop with a different aperture, to change the advancement direction of the principal ray of the illumination light. In this stage, an aerial image produced by imaging the test pattern of the reticle is measured or, alternatively, a corresponding pattern image TPa is transferred to the photosensitive substrate, at a different position thereon. On the basis of plural aerial image positions obtained by repeating the above-described procedure or, alternatively, of positions of plural transferred pattern images TPa having been developed and measured, a particular Zernike coefficient in regard to the wavefront aberration on the pupil plane 10a of the projection optical system 10 is measured. Details of this measurement process will be explained below, in conjunction with specific examples in relation to each Zernike term.

Figure 2:
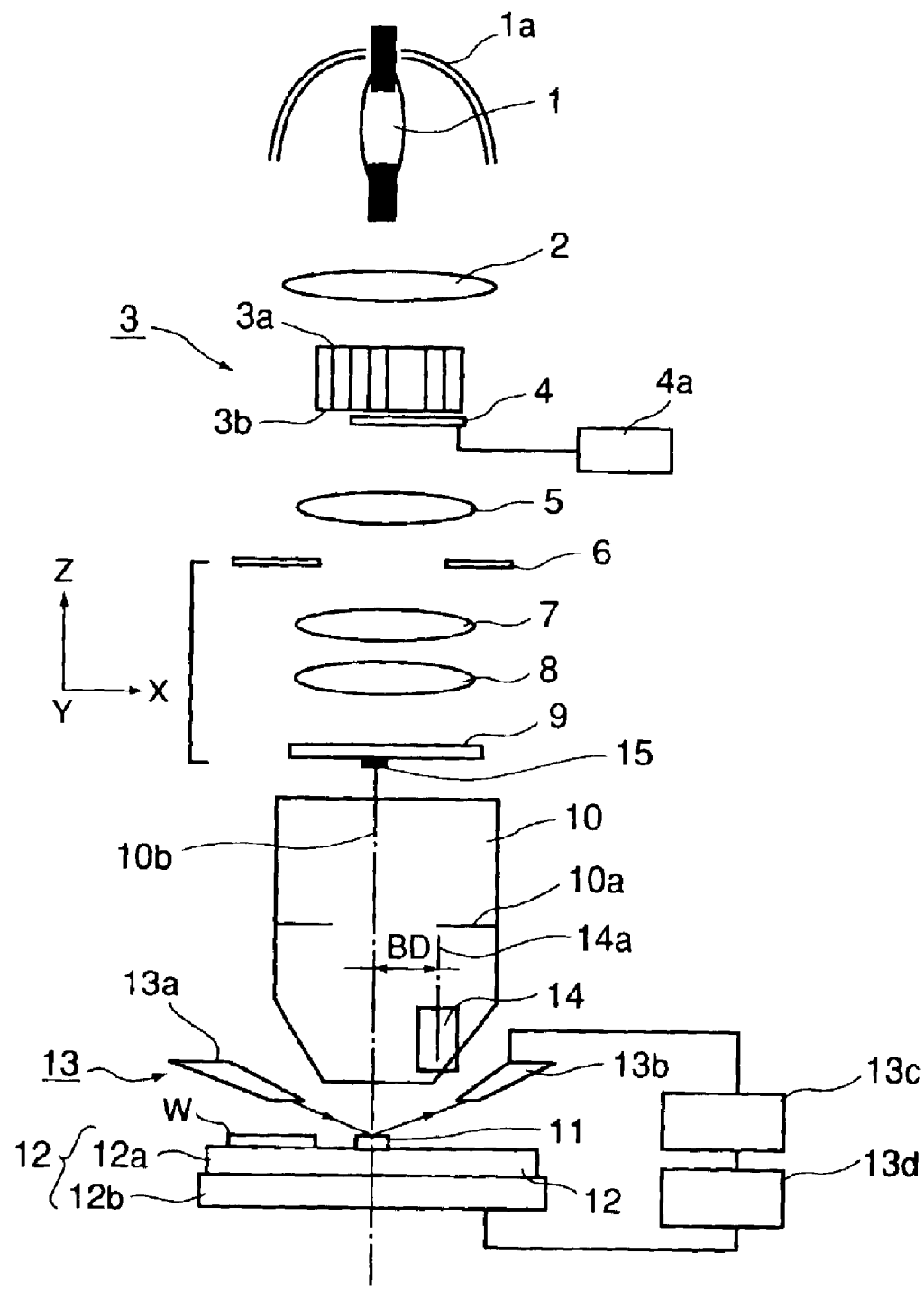
FIG. 2 is a schematic view of a projection exposure apparatus, as a whole, according to the present invention.

FIG. 2 is a general and schematic view of a projection exposure apparatus according to this embodiment of the present invention. FIG. 1 corresponds to a schematic and perspective view of a portion of FIG. 2.

Figure 3:
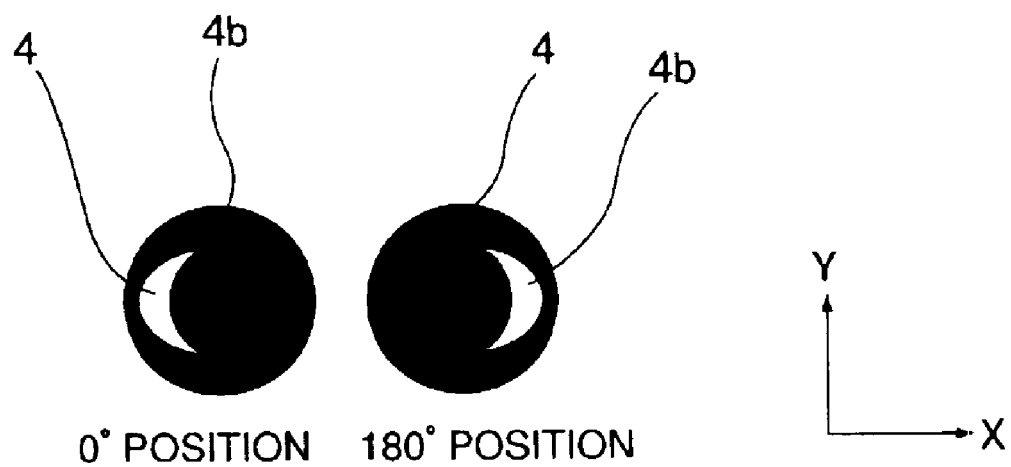
FIG. 3 is a schematic view for explaining a portion of an illumination system according to the present invention.

In FIG. 2, denoted at 1 is a light source for providing exposure light, and it may comprise a high-pressure Hg lamp or an excimer laser, for example. When a high-pressure Hg lamp is used, the exposure light emitted from the light source 1 is collected by an elliptical mirror 1a and, after this, it goes through an input lens 2 and enters a light entrance surface of a fly's eye lens 3. On a reticle side focal plane 3b (a lens surface or a plane in air) of the fly's eye lens 3, there are a large number of secondary light sources formed. The exposure light emitted from these secondary light sources goes by way of an illumination aperture stop 4, a first relay lens 5, a projection type reticle blind 6, a second relay lens 7, and a main condenser lens 8, and it illuminates the pattern surface of the reticle 9 as a whole with uniform illuminance. Here, the aperture stop 4 can be actuated by a driving system 4a as shown in the drawing, so that the position of the aperture 4b thereof can be changed in a rotational direction as desired, as shown in FIG. 3. With this arrangement, the incidence direction (azimuth angle) of the principal ray LP of the illumination light upon the reticle 9 can be changed as desired. By using this together with the test pattern 15, the light beams from the pattern can be collected selectively to the pupil region 10a of the projection lens 10. The projection type reticle blind 6 and the pattern bearing surface of the reticle 9 are conjugate with each other, and thus, the projection type reticle blind 9 defines an illumination region on the reticle 9. The rear focal plane 3b of the fly's eye lens 3 is approximately conjugate with the pupil plane 10a of the projection lens 10.

The pattern of the reticle 9 is projected onto a photosensitive substrate (wafer) W through the projection optical system 10.

Figure 4:
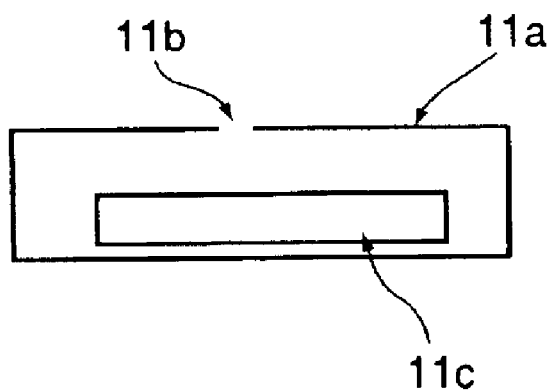
FIG. 4 is a schematic view for explaining a detection system in positional deviation detection.

By means of the exposure light passed through the aperture stop 4, an image of the test pattern 15, formed on the pattern bearing surface of the reticle 9, is imaged upon a plate 11a which constitutes a detection system 11 mounted on a wafer stage 12. FIG. 4 is an enlarged view of the detection system 11. As shown in FIG. 4, the plate 11a is formed with a slit 11b. Light passed through the slit 11b is photoelectrically converted and detected by a photoreceptor 11c. The detection system 111 comprising plate 11a, slit 11b and photoreceptor 11c, is mounted on the wafer stage 12. The wafer stage 12 comprises an X-Y stage 12a for positioning a wafer or the detection system 11 at any arbitrary position along a plane orthogonal to the optical axis 10b of the projection optical system 10, and a Z stage 12b for setting the position (focus position) of the wafer or the detection system 11 in a direction parallel to the optical axis 10b of the projection optical system, for example.

In this embodiment, there is an autofocus system 13 for detecting the focus position of the detection system 11. The autofocus system 13 comprises a light sending system 13a for projecting an image of detecting a slit-like pattern, for example, onto the upper surface of the plate 11a of the detection system 11, in an oblique direction with respect to the optical axis 10b of the projection optical system 10, and a light receiving system 13b for receiving reflection light from the imaging plane to re-image the image of this detecting pattern. As the focus position of the upper surface of the plate 11a changes, in the light receiving system 13b, there occurs a change in position of the image of the detection pattern being re-imaged. Thus, by detecting the position of this image, any change in the focus position of the plate 11a can be detected. The light receiving system 13b has a photoelectric detector 13c included therein, for producing a focus signal which is variable with the position of the re-imaged detection pattern. Thus, by moving the Z stage 12b of the wafer stage 12 through a control system 13d so that this focus signal is kept at a predetermined level corresponding to the image plane position of the optical system 10, the focus position of the upper surface of the plate 11a can be held at the image plane of the projection optical system 10.

Also, since the focus signal changes approximately rectilinearly with a change in focus position within a predetermined range (predetermined range in the optical axis direction), a change in focus position can be detected from a change in level of the focus signal, and vice versa. The Z stage 12b of the wafer stage 12 has a level sensor (not shown) incorporated therein, for detecting the position of the Z stage itself in the optical axis 10B direction of the projection optical system 10.

Denoted at 14 is an off-axis type wafer alignment system. The wafer alignment system 14 detects alignment marks formed adjacent to each shot area on the wafer W, respectively. In this case, by detecting the spacing between the detection center 14a of the wafer alignment system 14 and a conjugate image of the center of the reticle 9, that is, what is called a baseline quantity BD, in advance, alignment of each shot area of the wafer W can be accomplished accurately on the basis of the alignment mark position as measured by the wafer alignment system 14. Further, the wafer alignment system 14 can be used to detect various marks.

Figure 5A:
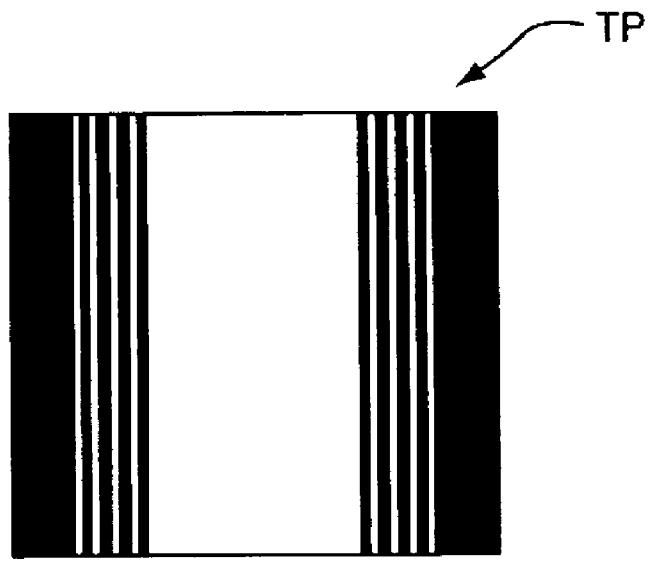
FIGS. 5A and 5B are schematic views, respectively, of a test pattern according to the present invention.
Figure 5B:
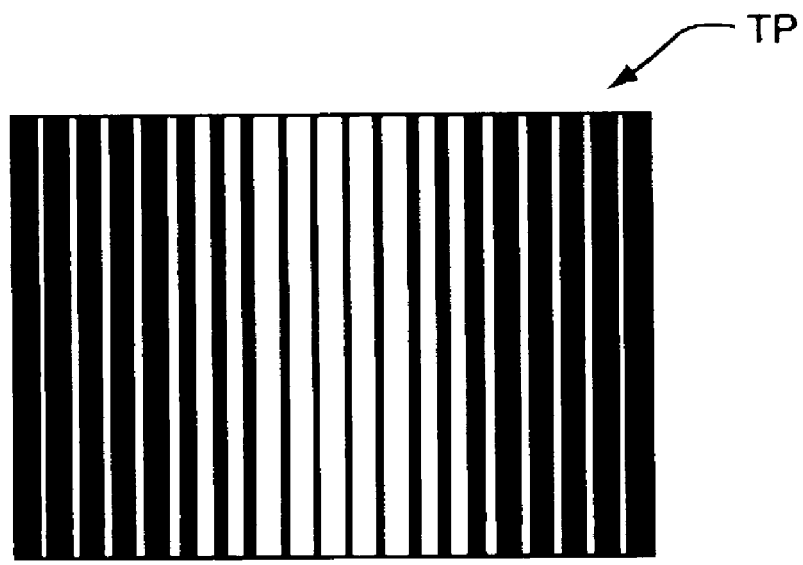
Figure 6:
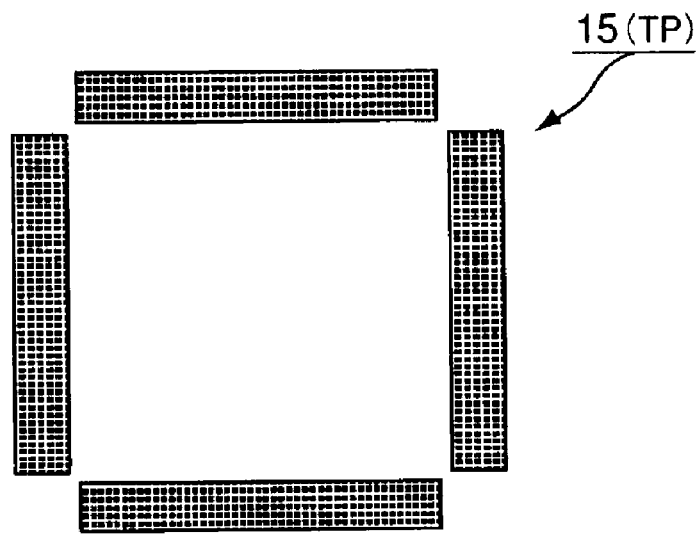
FIG. 6 is a schematic view of a test pattern according to the present invention.
Figure 7:
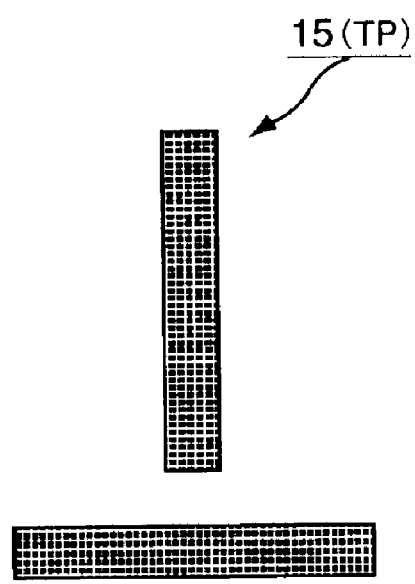
FIG. 7 is a schematic view of a test pattern according to the present invention.
Figure 8A:
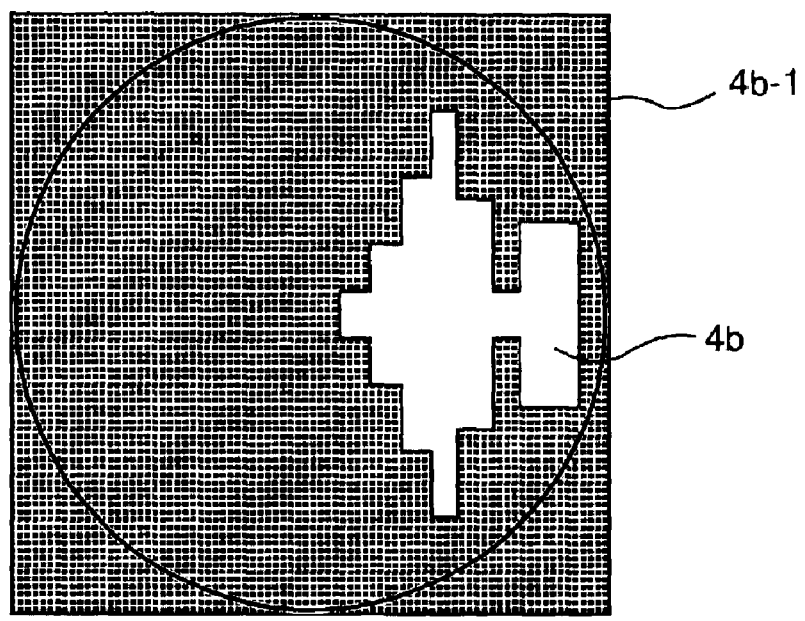
FIGS. 8A–8F are schematic views, respectively, for explaining an aperture stop for illumination, according to the present invention.
Figure 8B:
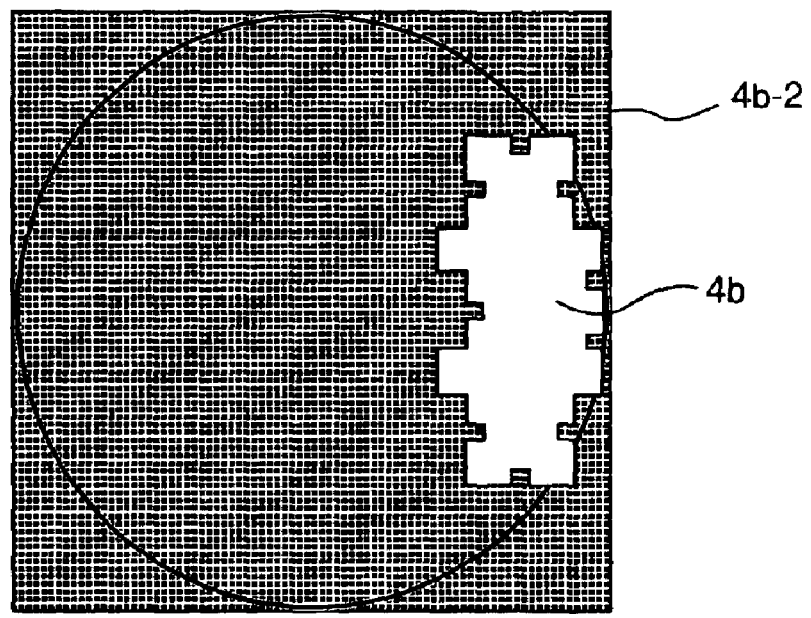
Figure 8C:
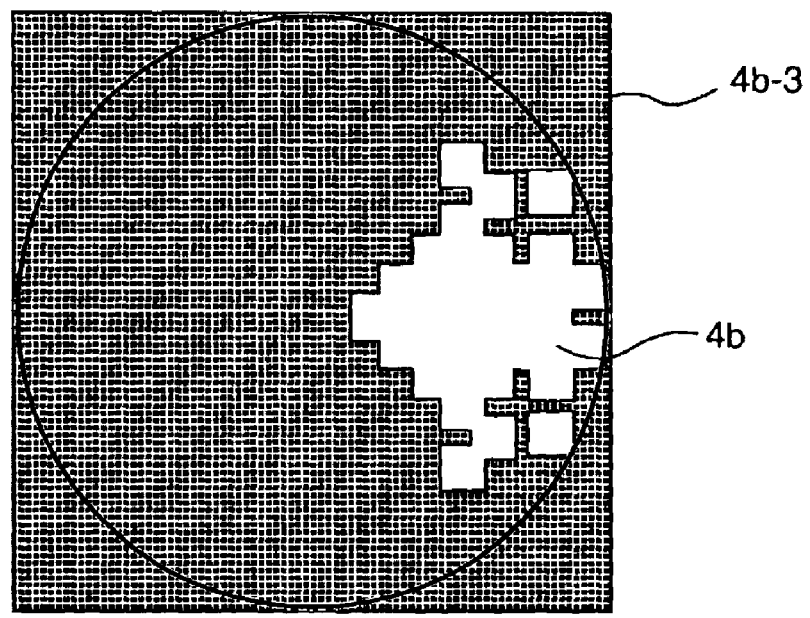
Figure 8D:
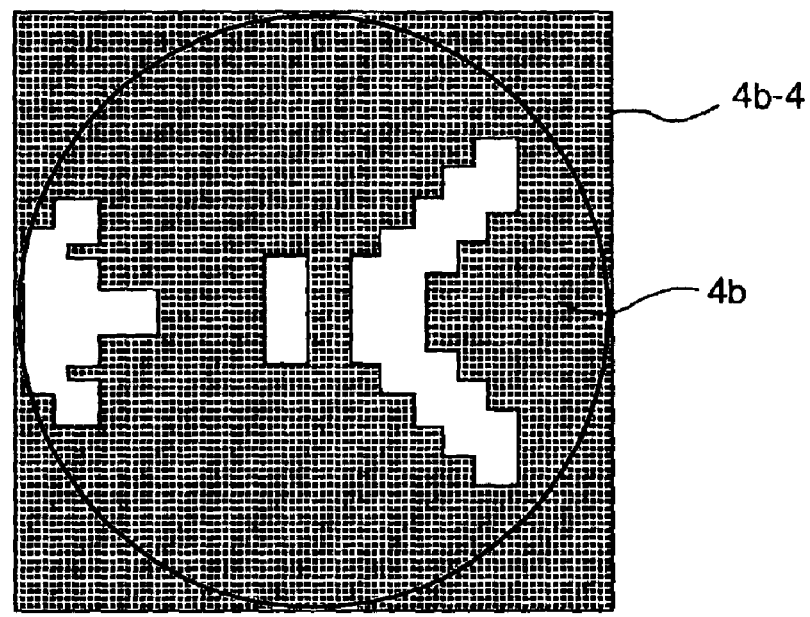
Figure 8E:
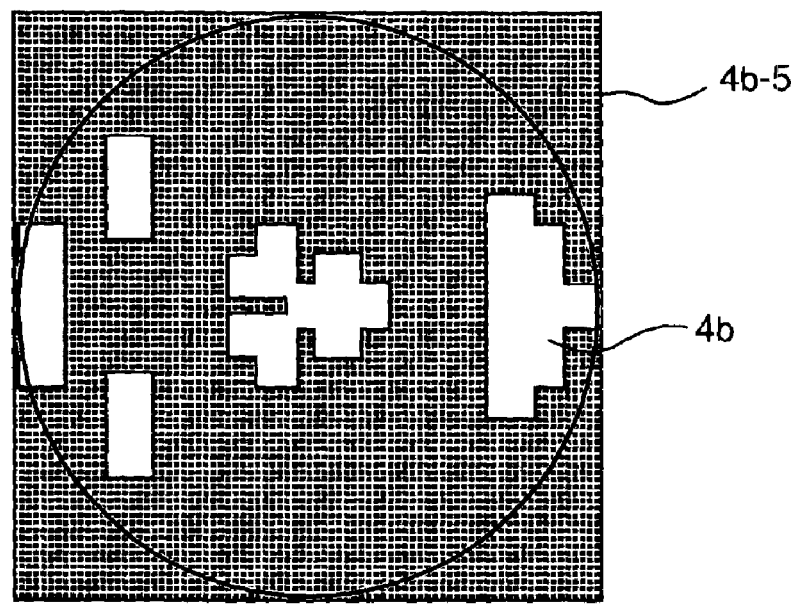
Figure 8F:
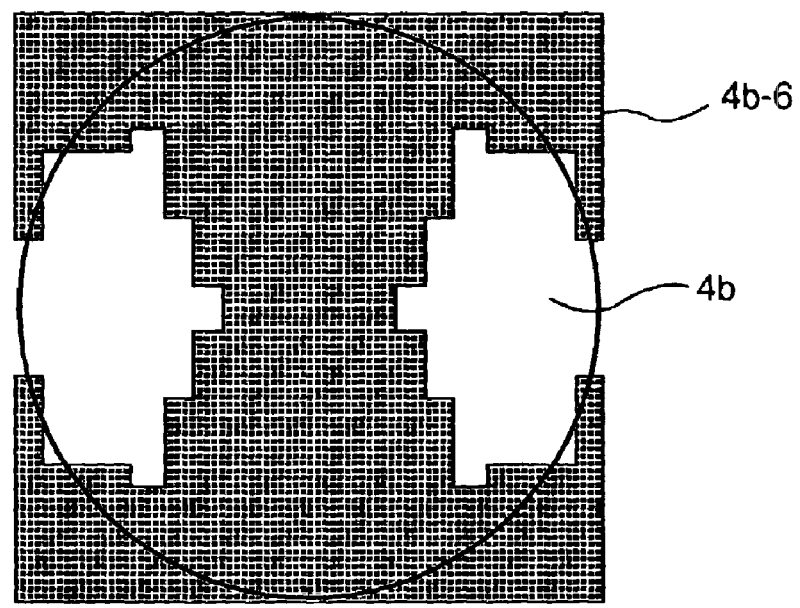
Figure 18:
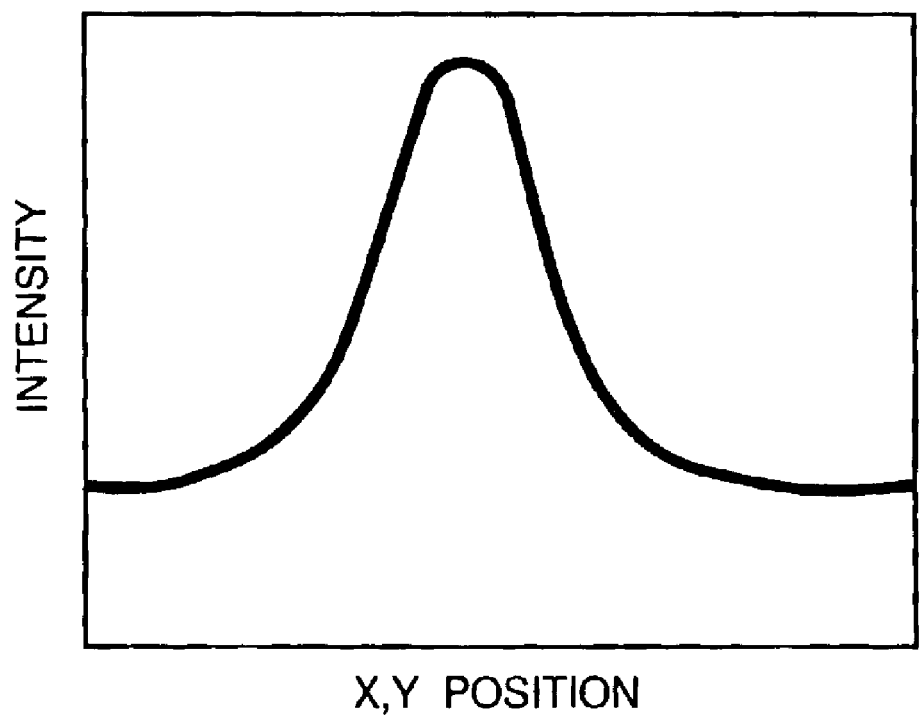
FIG. 18 is a schematic view for explaining a light intensity distribution of a mark image in the positional deviation detecting process according to the present invention.

FIGS. 5A and 5B show details of test patterns usable in this embodiment. Basically, either of these patterns is used. FIGS. 6 and 7 show examples of disposition of test patterns (marks) to be used. A first illumination light defined by the aperture stop 4 is projected to this test pattern, and an image of the test pattern is imaged by the projection optical system 10 on the plane 11a which is mounted on the wafer stage 12. Then, the wafer stage 12 is moved along the image plane (within the X-Y plane), and the light passed through the slit pattern 11b provided on the plate 11a is detected by use of the photoreceptor 11c, which comprises a light intensity detector or a light quantity detector, for example. Then, the wafer stage 12 is moved in the optical axis 10b direction (Z direction) of the projection optical system 10 and, subsequently, the wafer stage 12 is moved in the same direction as the incidence direction of the first illumination light and along the image plane, and the light passed through the slit pattern 11b is detected by use of the detector 11c. Then, the center position of the test pattern (image) 15 as imaged upon the plate 11a is calculated, on the basis of a detection signal (FIG. 18) representing the X-Y position of the slit pattern 11b, as well as the detected light intensity or light quantity at that position.

Subsequently, the position of the aperture of the aperture stop 4 is rotated or, alternatively, the shape of the aperture is changed. Then, the center position of the test pattern image 15, on the X-Y plane and at the same Z position, is calculated similarly as described above. Based on this, a positional deviation amount of the test pattern can be detected. Furthermore, the position of the aperture 4b of the aperture stop is rotated or the shape thereof is changed and, thereafter, the above-described procedure is repeated several times.

The aperture 4b of the illumination aperture stop 4 to be used here has a shape which differs with the Zernike term (coefficient) to be obtained.

FIGS. 8A–8F show examples of aperture stops 4b-1 to 4b-6 which correspond to several Zernike terms, respectively. Denoted in these drawings at 4b are apertures. FIGS. 9A–9K are graphs showing Zernike sensitivities corresponding to these aperture stops (aperture shapes), respectively. FIG. 10 illustrates measurement processes.

Illustrated in the graphs of FIGS. 9A–9K are the results obtained through different processes, being different with the Zernike coefficients, respectively, as shown in FIG. 10. It is seen from FIGS. 9A–9K that these aperture stops and the measurement processes shown in FIG. 10 are designed optimally to be sensitive to particular Zernike terms, respectively.

In FIG. 10, each character C represents a Zernike coefficient. Each subscript numeral of the character C designates the term. Symbols $\hat{1}$ and $\hat{2}$ mean that they concern the same Zernike coefficient, but the processes and aperture shapes are different. Specifically, as for $C5\hat{1}$ and $C5\hat{2}$, the apertures have the same shape, but the direction of disposition of them is different. Taking $C5\hat{1}$ as an example, the sequence will be explained. Now, the initial aperture stop position is denoted by d1 and the second position taken by rotating the aperture 4b-1 by 180 degrees is denoted by d2. By detecting the central positions of the test pattern 15 images as defined by these aperture stop positions d1 and d2, a positional deviation amount S1 (=d1−d2) corresponding to the difference between them can be obtained. Here, in relation to each aperture stop position d1 and d2, two types of quantities are measured as the positional deviation amount. One is a V pattern (deviation in the X direction), and the other is an H pattern (deviation in the Y direction). The positional deviation with respect to each of them can be expressed as SV(d1−d2) and SH(d1−d2), respectively. Further, a third position d3 rotated by 90 degrees from the aperture position d1 as well as a fourth position d4 rotated further by 180 degrees are set, and on the basis of images formed with respect to these two states of aperture positions d3 and d4, positional deviations SV(d3−d4) and SH(d3−d4) are obtainable. On the basis of these positional deviations and the Zernike sensitivity $Zer5\hat{1}$ of the coefficient C5 in the graphs of FIGS. 9A and 9B or, alternatively, of sensitivity coefficients obtained by experiments, $C\hat{5}1$ can be obtained by the following calculation.

$$C\hat{5}1=\{SV(d1-d2)-SH(d3-d4)\}/Zer5 \quad 1$$

Similarly, from the states d1', d2', d3' and d4' defined by rotating the aperture positions by 45 degrees, respectively, while holding the shape of the aperture 4b-1 unchanged, $C\hat{6}1$ can be obtained through the following calculation.

$$C\hat{6}1=\{SV(d1'-d2')+SH(d1'-d2')+SV(d3'-d4')-SH(d3'-d4')\}/Zer6 \quad 1$$

In FIG. 10, $C\hat{5}2$ and $C\hat{6}2$ are each explained as another example of a measuring process for measuring C5 or C6. By using the aperture 4b-2 and by measuring the center positions of the images in the states of aperture stop rotational positions e1–e4 and e1'–e4' similarly as described above, $C\hat{5}2$ and $C\hat{6}2$ can be obtained in accordance with the following definition equations.

$$C\hat{5}2=\{SH(e1-e2)-SV(e1-e2)+SH(e3-e4)+SV(e3-e4)\}/Zer5 \quad 2$$

$$C\hat{6}2=\{SH(e1'-e2')+SV(e3'-e4')\}/Zer6 \quad 2$$

Figure 9A:
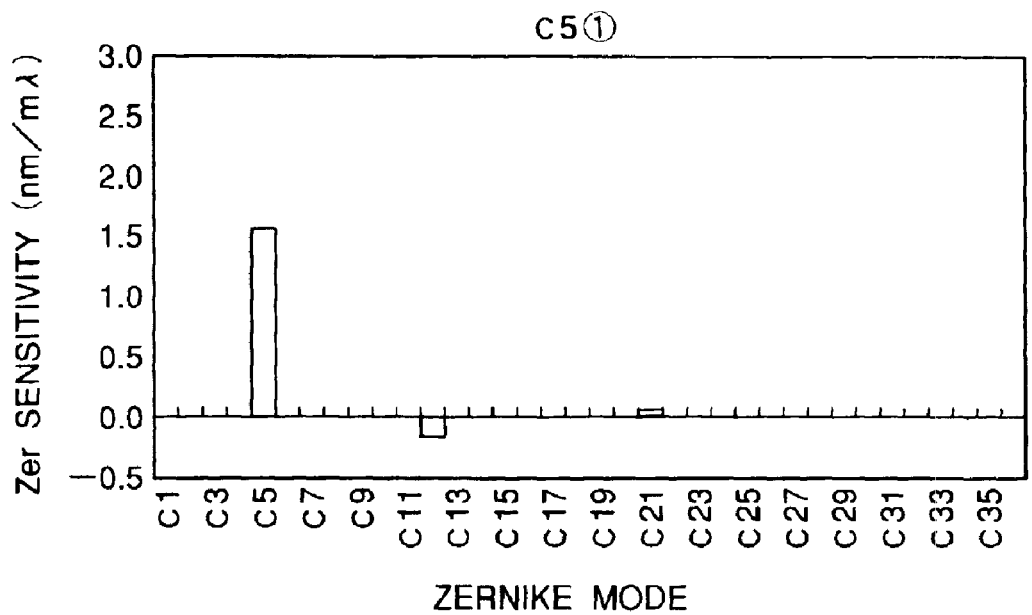
FIGS. 9A–9K are graphs, respectively, for explaining optimization when stops shown in FIGS. 8A–8F are used.
Figure 9B:
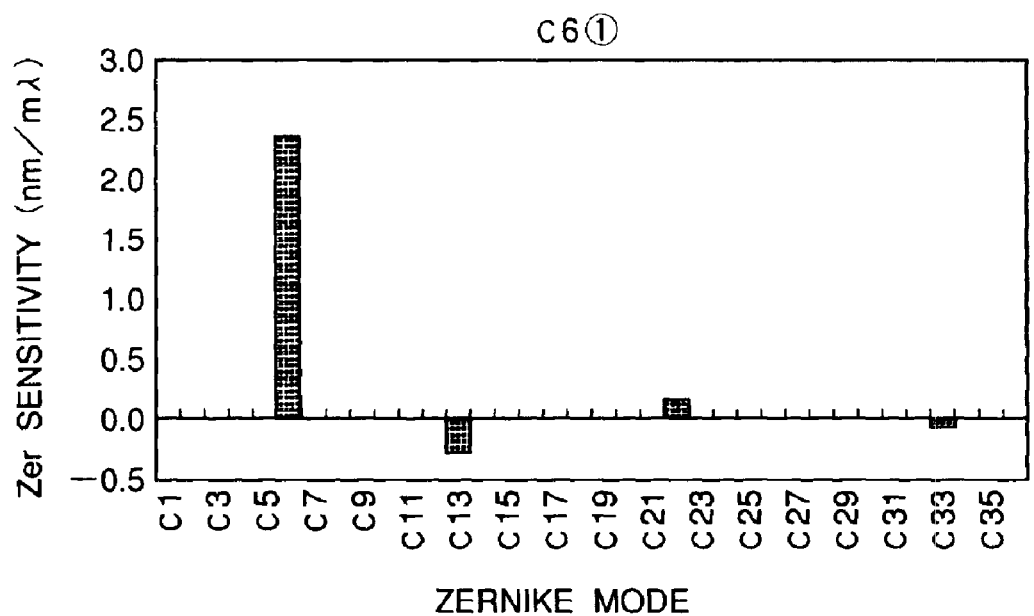
Figure 9C:
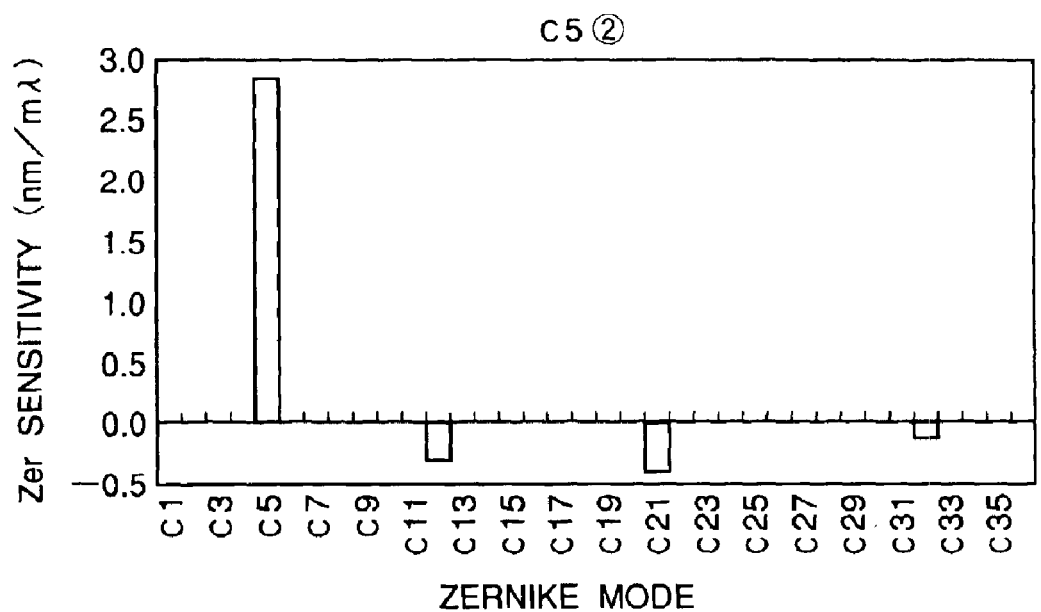
Figure 9D:
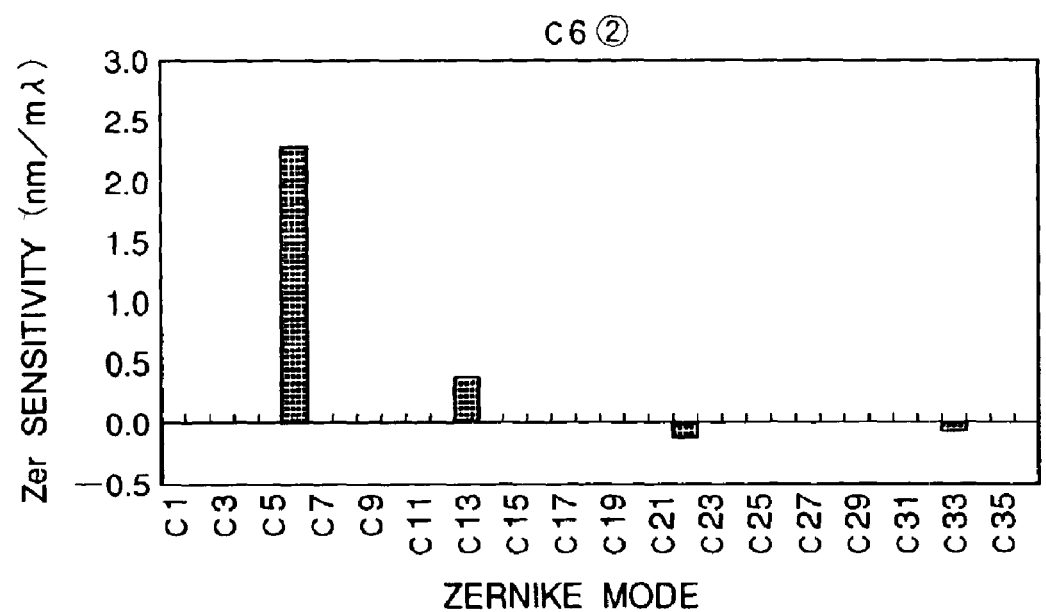

The sensitivity coefficients $Zer5\hat{2}$ and $Zer6\hat{2}$ are those Zernike sensitivities in the graphs of FIGS. 9C and 9D obtained similarly by calculation in advance or, alternatively, those prepared on the basis of experiments.

Next, referring to FIG. 10, the manner of measurement and calculation of Zernike coefficients in the spherical aberration (0θ) terms C4, C9 and C16 will be explained. As regards the aperture stops, in relation to C4, C9 and C16, those denoted at 4b-3, 4b-4 and 4b-5 in FIG. 8 are usable, as an example. It is seen from FIG. 10 that, as regards the aperture stop rotational positions corresponding to C4, C9 and C16, there are eight types f1–f8 all being different by 45 degree pitch in the rotational direction. Similarly, as described above, the calculation formulae for C4, C9 and C16 are defined as follows.

$$C4=\{\sqrt{2}\{SV(f1-f2)+SH(f3-f4)\}+SH(f5-f6)+SV(f5-f6)+SH(f7-f8)-SV(f7-f8)\}/2/Zer4$$

$$C9=\{\sqrt{2}\{SV(f1-f2)+SH(f3-f4)\}+SH(f5-f6)+SV(f5-f6)+SV(f5-f6)+SH(f7-f8)-SV(f7-f8)\}/2/Zer9$$

$$C16=\{\sqrt{2}\{SV(f1-f2)+SH(f3-f4)\}+SH(f5-f6)+SV(f5-f6)+SH(f7-f8)-SV(f7-f8)\}/2/Zer16$$

Figure 9E:
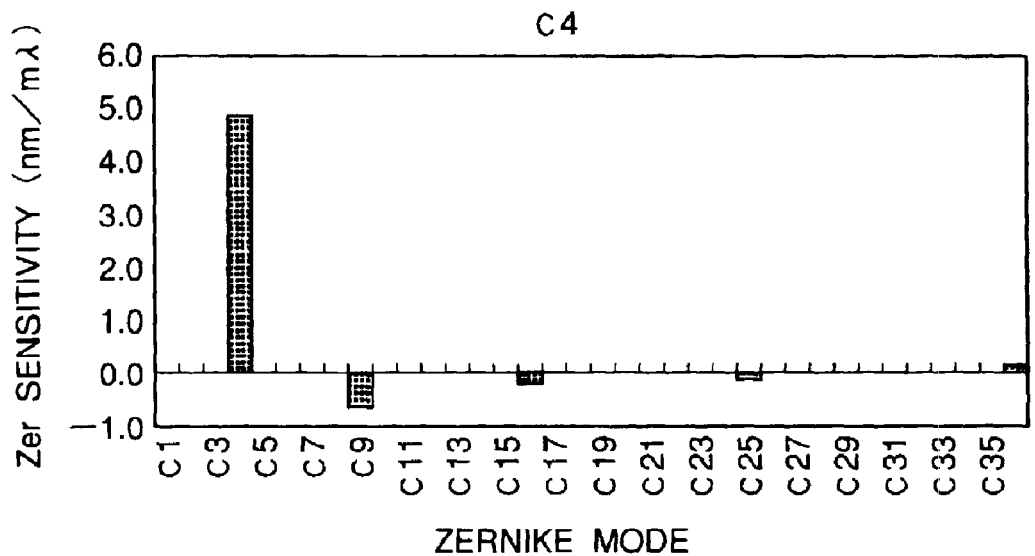
Figure 9F:
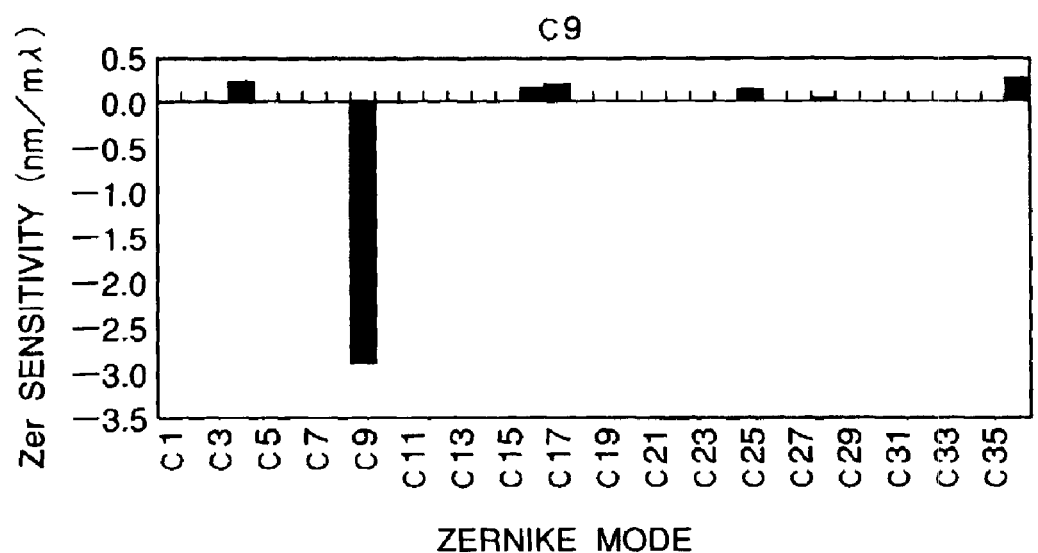
Figure 9G:
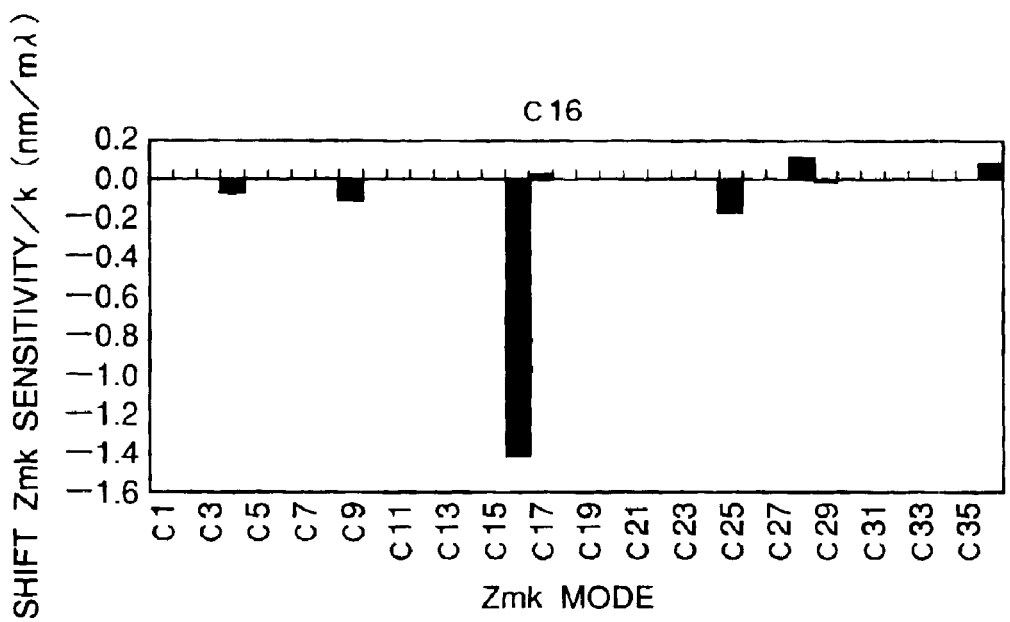
Figure 9H:
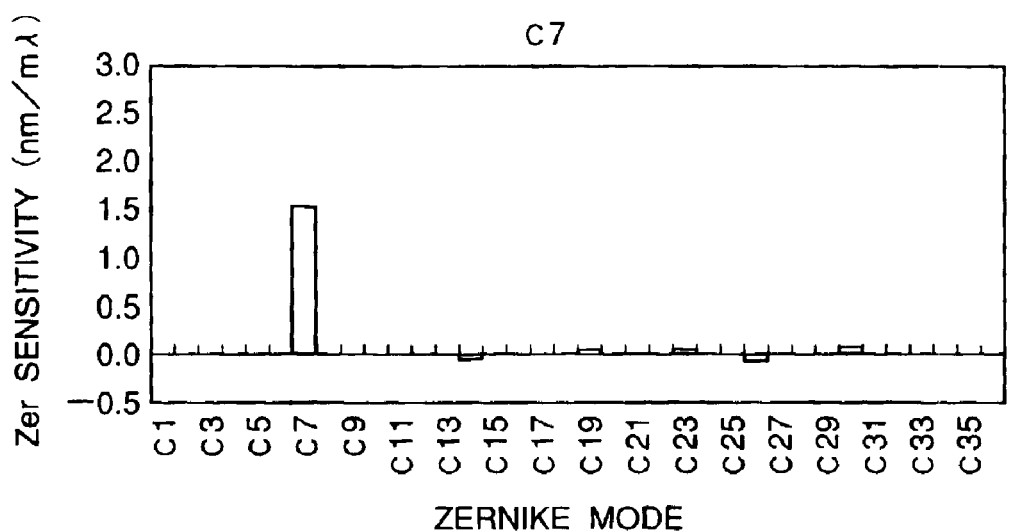
Figure 9I:
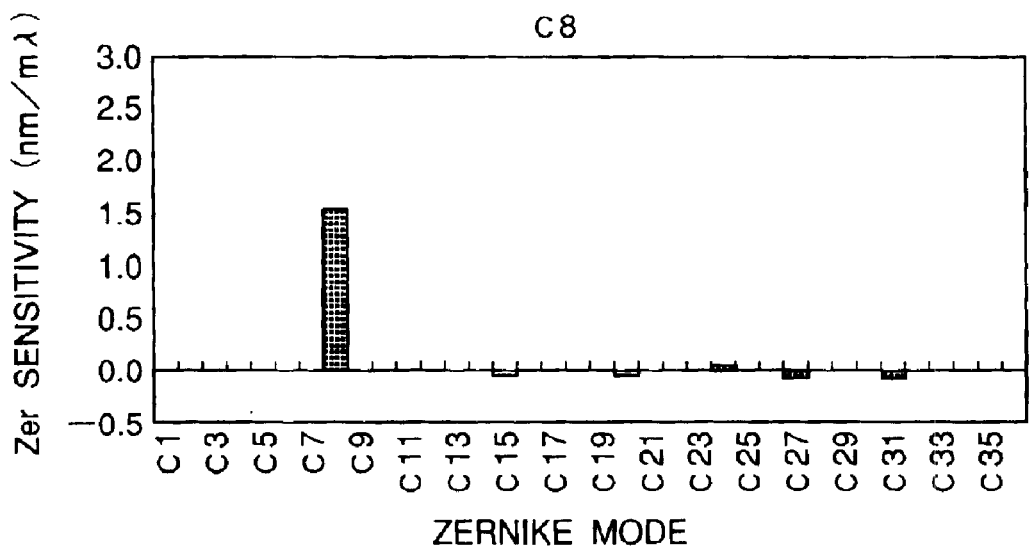
Figure 9J:
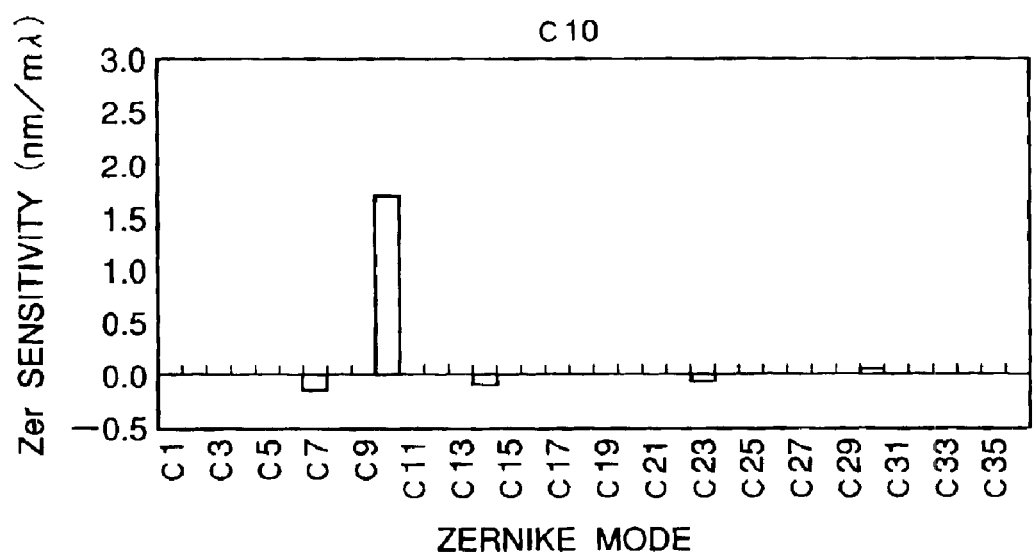
Figure 9K:
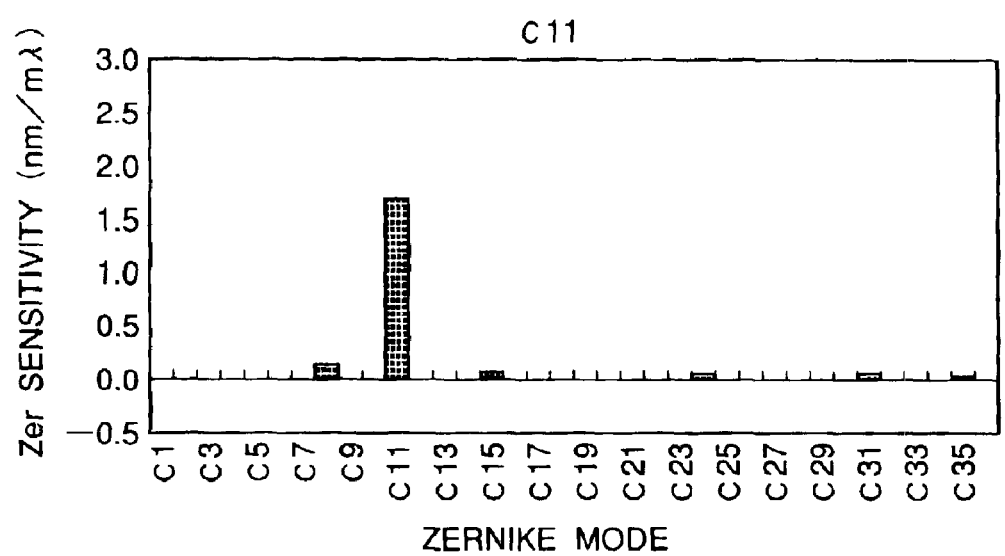
Figure 11A:
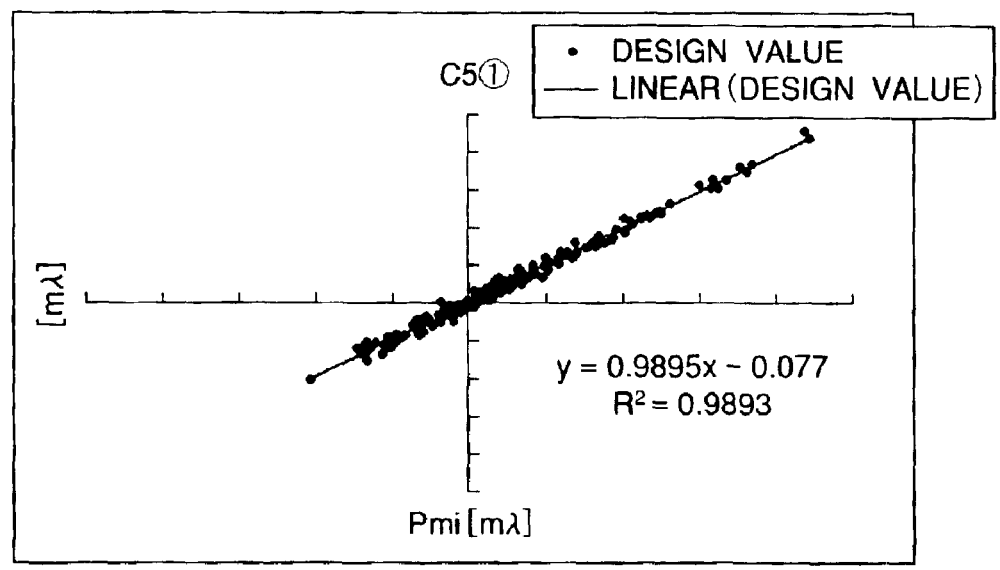
FIGS. 11A–11K are graphs, respectively, for explaining evaluation results when steps shown in FIGS. 8A–8F are used.
Figure 11B:
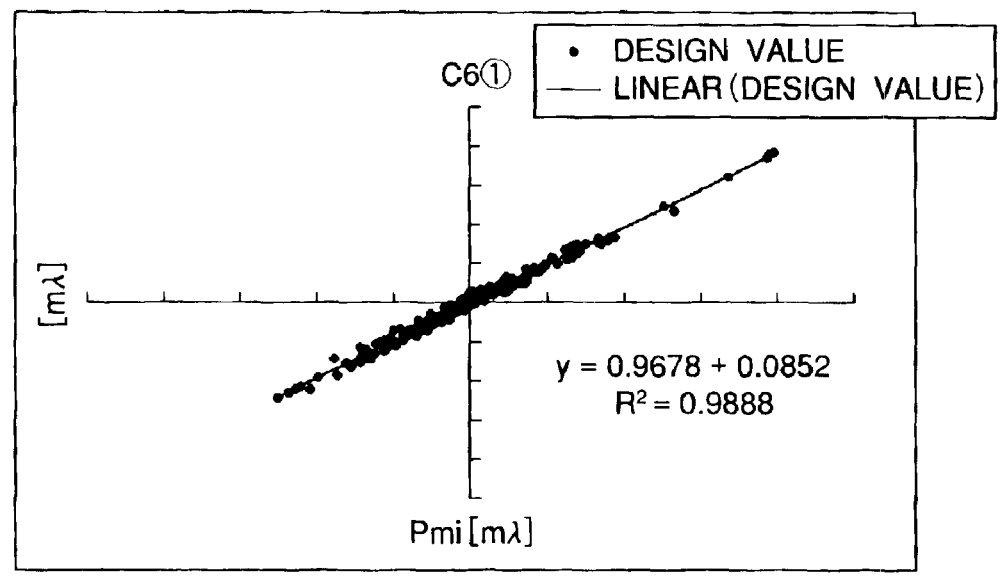
Figure 11C:
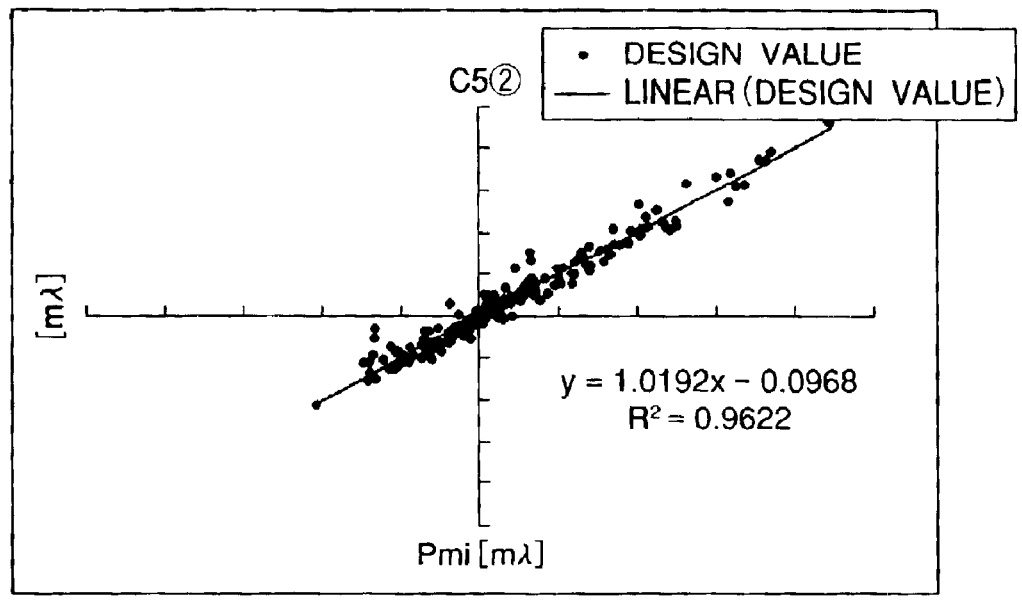
Figure 11D:
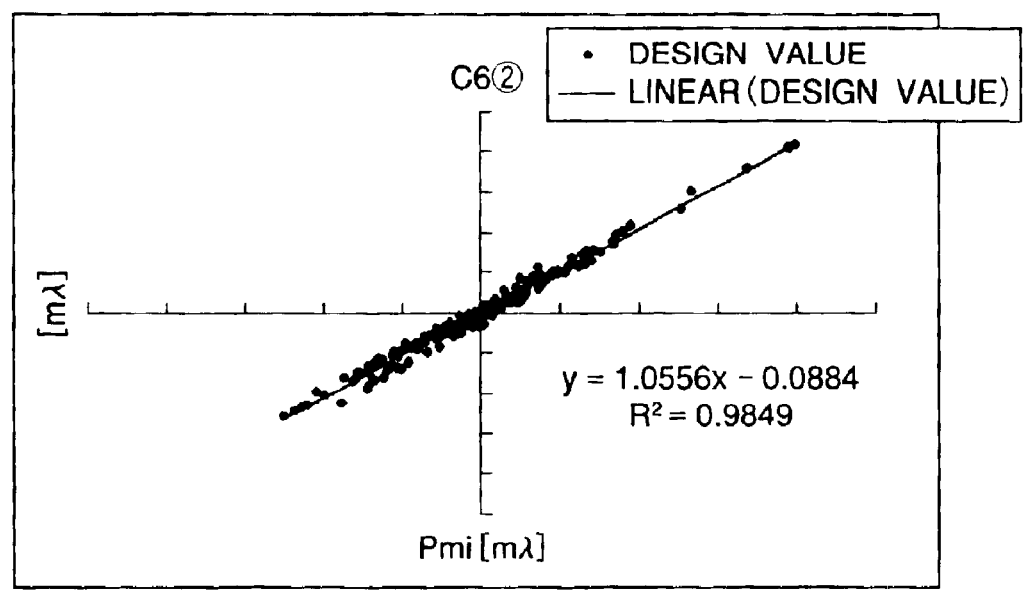
Figure 11E:
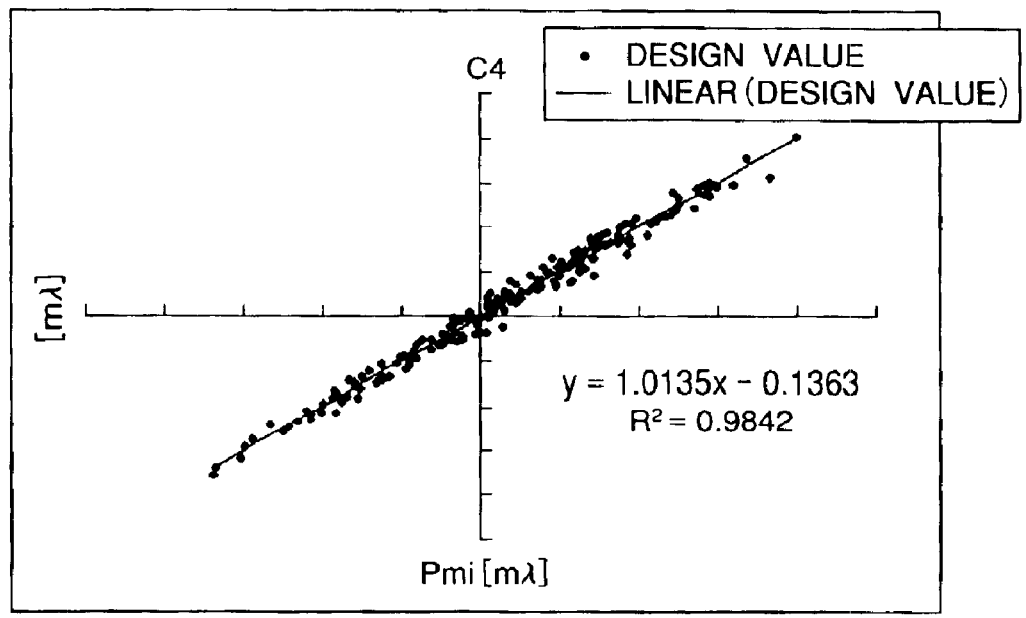
Figure 11F:
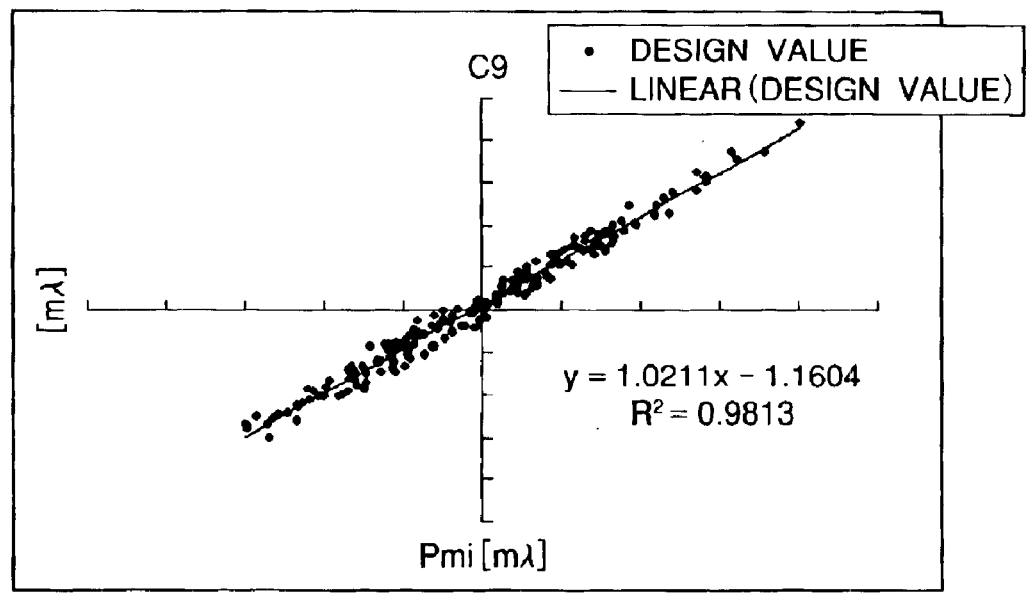
Figure 11G:
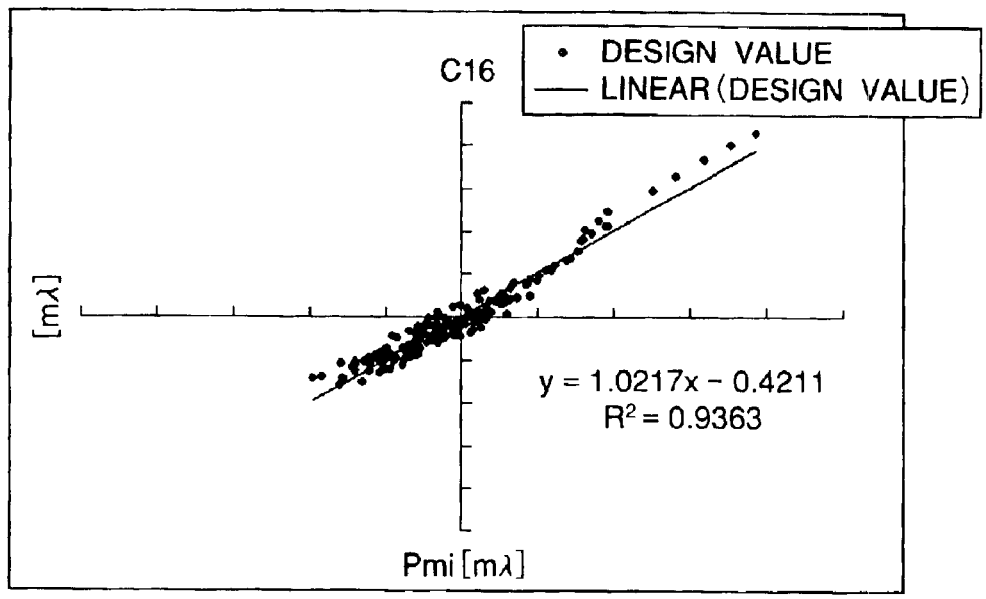
Figure 11H:
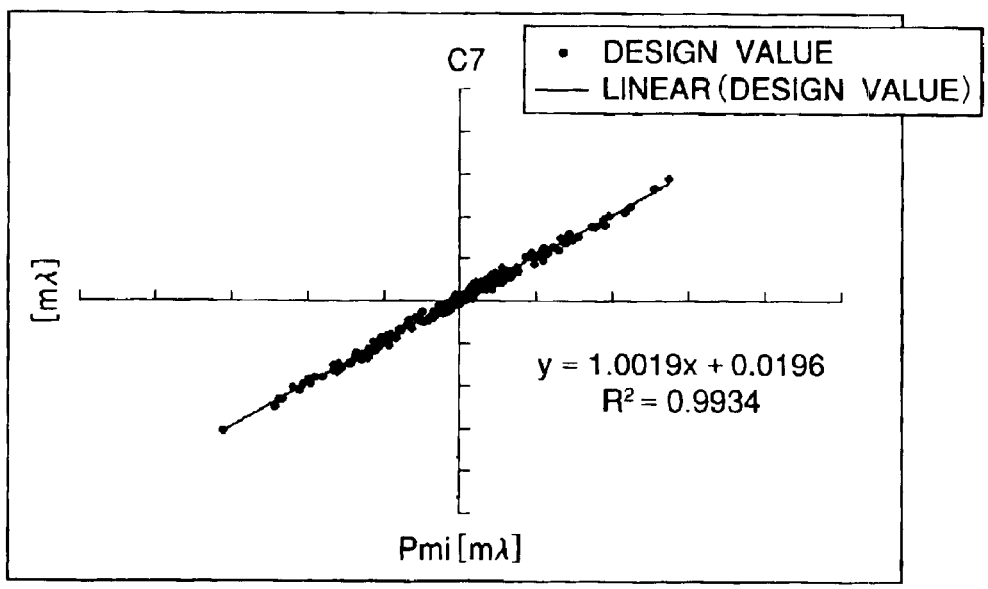
Figure 11I:
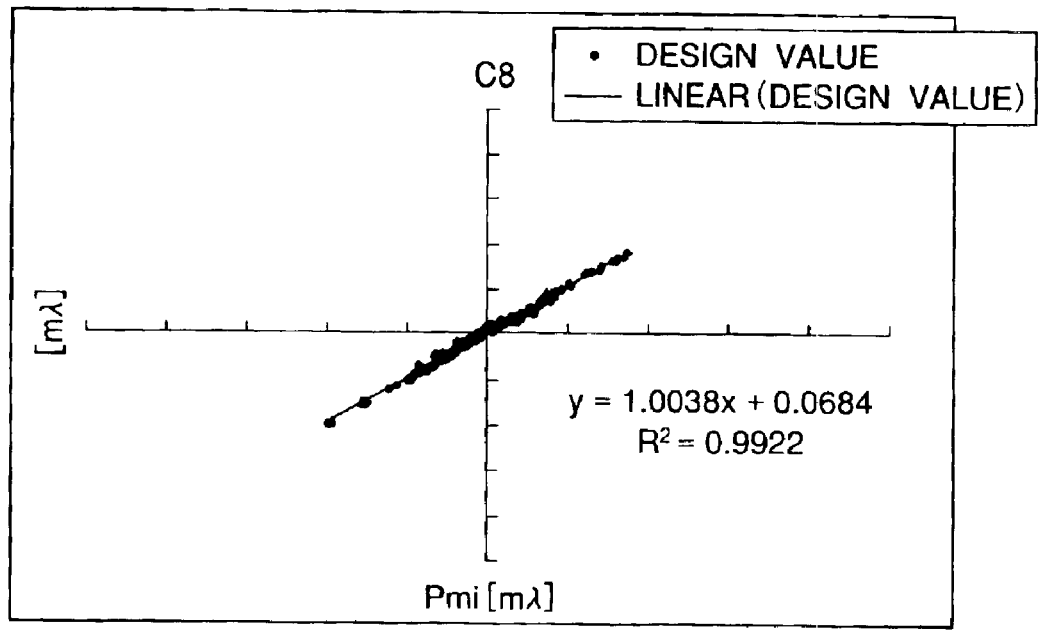
Figure 11J:
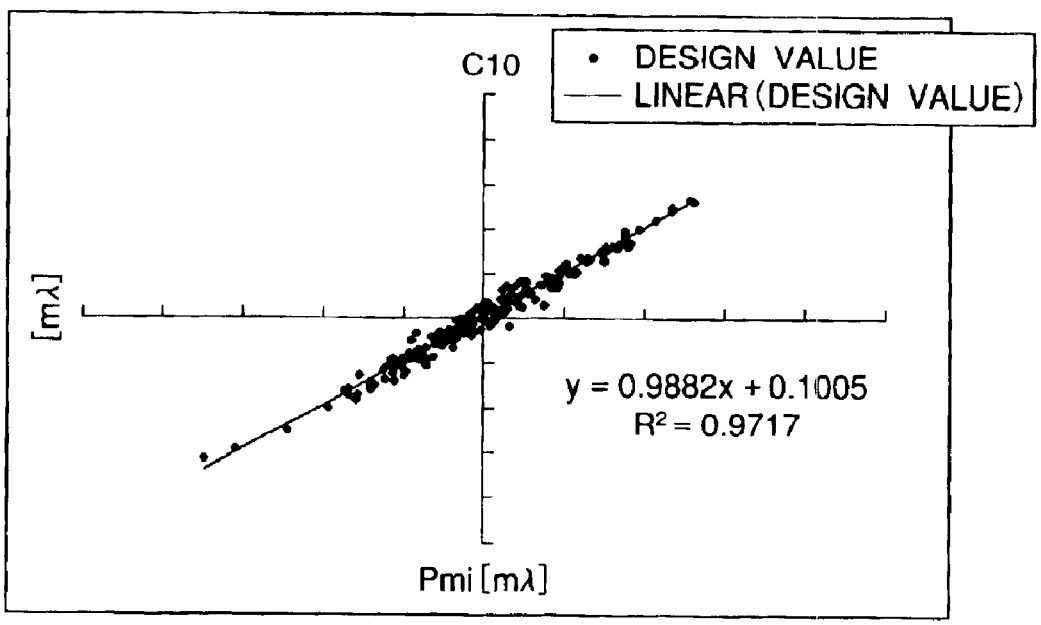
Figure 11K:
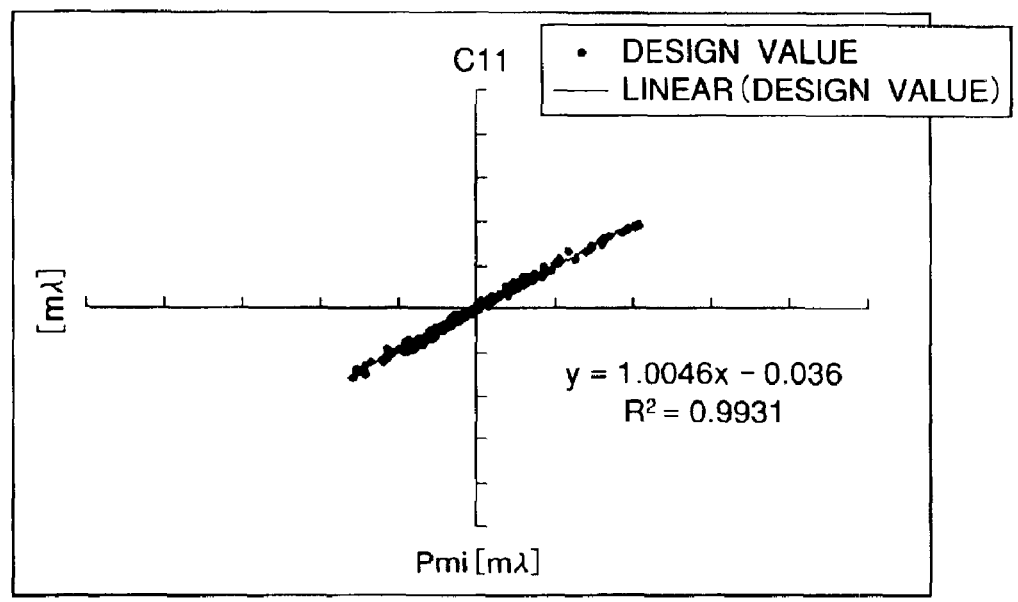

As regard Zer4, Zer9 and Zer16, similarly, those Zernike sensitivities shown in FIGS. 9E, 9F and 9G or, alternatively, those obtained by experiments, are used.

It should be noted that, although it is not mentioned here, the Zernike coefficients for terms C25 and C36 can be defined by the same equations.

Next, referring to FIG. 10, terms C7, C8, C10 and C11, which are called coma aberration terms, will be explained. For the terms C7, C8, C10 and C11, a common aperture stop is usable. An example is shown at 4b-6 in FIG. 8. It is seen from FIG. 10 that, as the aperture stop rotational positions, if g1 among imagewise illustrations g1–g4 is taken as zero degree, g2 is at 90 degrees, g3 is at 45 degrees, and g4 is at 135 degrees, respectively. Through a similar procedure described above, the center positions of the images in the four rotational position states are detected and, from relative positional deviations of them, the Zernike coefficients are calculated in accordance with the following equations.

$$C7=\{SV(g1-g2)+SH(g3-g4)\}/Zer7$$

$$C8=\{-SH(g1-g2)+SV(g3-g4)\}/Zer8$$

$$C10=\{SV(g1-g2)-SH(g3-g4)\}/Zer10$$

$$C11=\{SH(g1-g2)+SV(g3-g4)\}/Zer11$$

As regards Zer7, Zer8, Zer10 and Zer11, similarly, those Zernike sensitivities shown in FIGS. 9H, 9I, 9J and 9K or, alternatively, those obtained by experiments, are used.

FIGS. 11A–11K illustrate the results of examinations made to absolute correlation with respect to a few actual projection lenses in accordance with the procedure described above. Here, as regards the Zernike coefficients of the practical lenses, those values based on measurement using an interferometer for wavefront aberration measurement were used.

It is seen from FIGS. 11A–11K that the measurement method of this embodiment has superior measurement precision sufficient for detecting Zernike coefficients (lens aberration). In the embodiment described above, the aperture 4b of the aperture stop 4 is optimized by a choice of two alternatives, that is, passing light and blocking light. However, when a light attenuating material is used and the density thereof at the aperture portion is changed, optimization with more improved precision is attainable. Further, by executing the optimization while setting the order higher, measurement of higher order aberration is enabled. In the embodiment described above, the center position of the image is detected by means of the detection system 11. However, a substrate of photochromic material may be provided on the wafer stage 12 and an image of the test pattern may be transferred to this photochromic material substrate. On the basis of the thus transferred image, without a development process, the center position of the image can be measured with the use of the off-axis alignment system 14 inside the apparatus.

Figure 12:
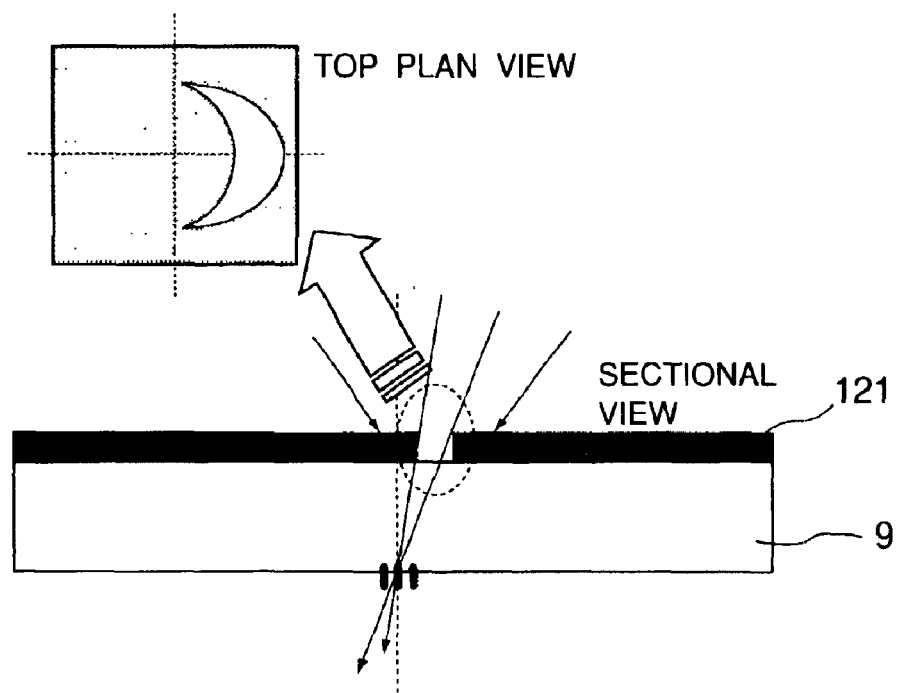
FIG. 12 is a schematic view for explaining a case wherein another example of the present invention is used.

In place of optimization of the effective light source using an aperture stop 4 of the illumination system, it is a possible alternative that, as shown in FIG. 12, a light blocking pattern 121 similar to the illumination system aperture stop 4b is provided on a glass surface of the reticle 9, which is on the opposite side of the pattern bearing surface. The light blocking pattern 121 is adapted to block light beams so as to define an effective light source of a shape being optimized with respect to the measurement pattern. Also, such a light blocking pattern may be provided on the reticle stage 12 and used in combination with the reticle. In these cases, it is necessary to prepare positional relations between the measurement marks and the light blocking patterns, in association with the illumination modes illustrated in FIG. 10.

Figure 16:
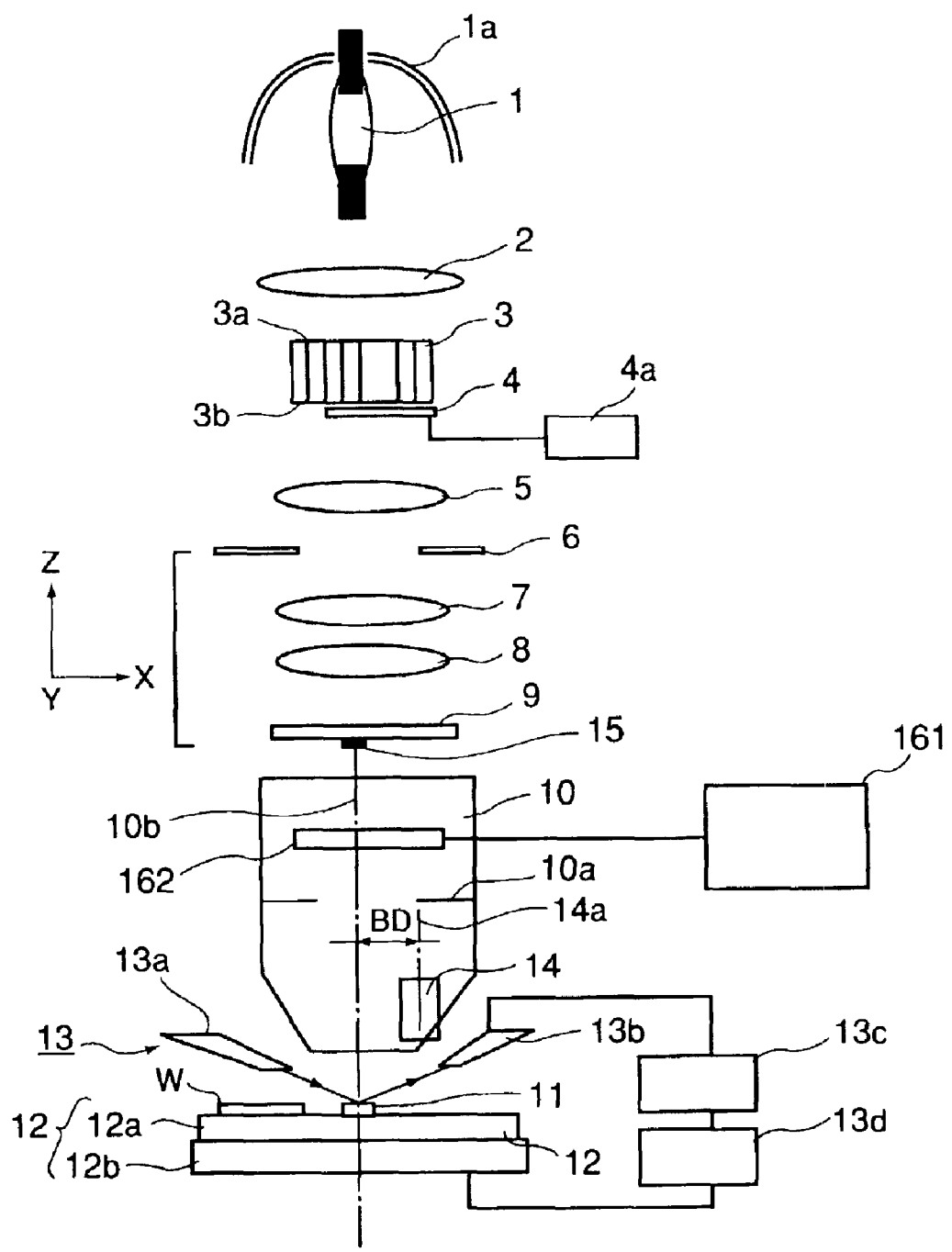
FIG. 16 is a schematic view of a correction system major assembly according to the present invention.
Figure 17:
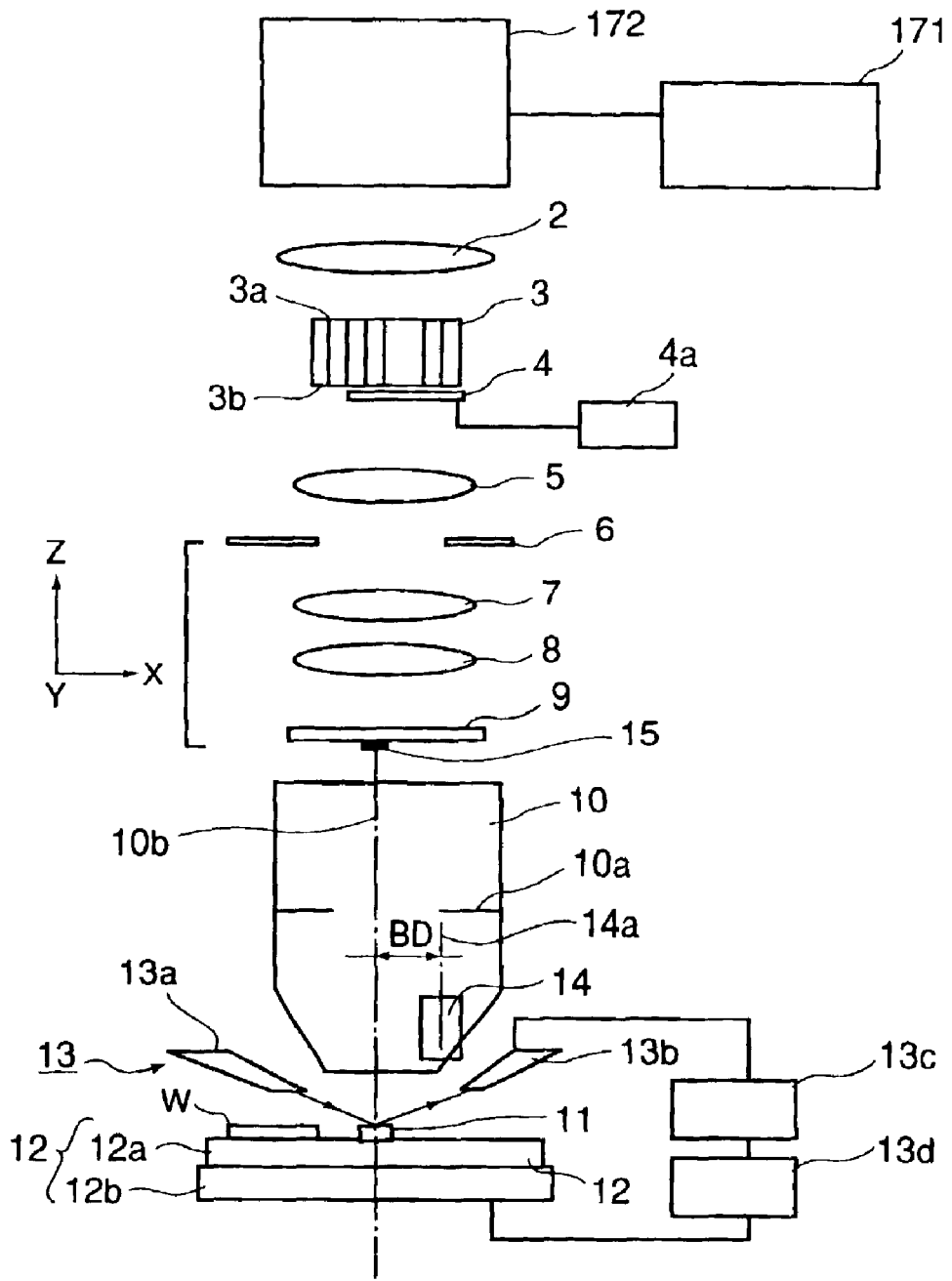
FIG. 17 is a schematic view of a correction system major assembly according to the present invention.

Further, a feedback system 161, 162 or 171 may preferably be provided, as shown in FIGS. 16 and 17, to feedback obtained measured values to the major assembly of the exposure apparatus. Aberrations of a projection optical system in an exposure apparatus can be corrected by correcting means, such as shown in FIG. 16 in which a correction optical system 162 inside a projection lens 10 is moved by driving means 161, or as shown in FIG. 17 in which the center wavelength of emission wavelength from a laser 172 is changed by wavelength changing means 171.

Next, a second embodiment of the present invention will be described.

Figure 13:
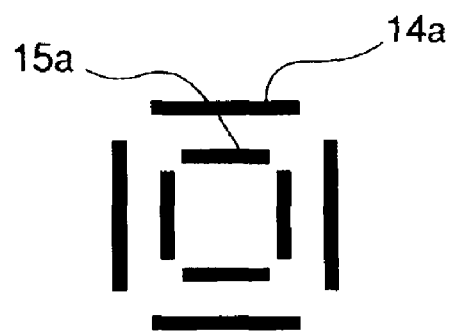
FIG. 13 is a schematic view of a test pattern according to a second embodiment of the present invention.
Figure 14:
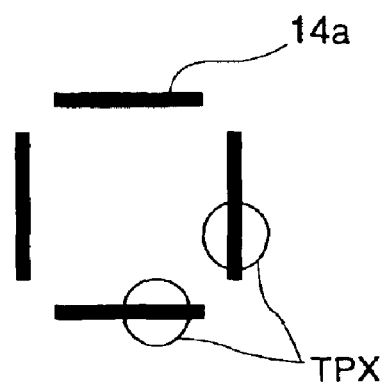
FIG. 14 is a schematic view of a test pattern according to the second embodiment of the present invention.
Figure 15:
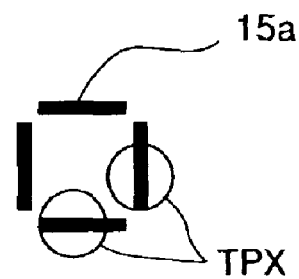
FIG. 15 is a schematic view of a test pattern according to the second embodiment of the present invention.

FIGS. 13–15 illustrate a specific example in which an image of a test pattern according to the second embodiment is transferred onto a photosensitive substrate (wafer) W. The test pattern used here differs from that of the first embodiment, and it has two types of marks for measurement of positional deviation of them when superposed one upon another (FIG. 13). FIGS. 14 and 15 just show these two types of marks.

In FIGS. 14 and 15, a portion TPX of a grid of each mark 14a or 15a has a pattern shape such as shown in FIG. 5A or 5B. The marks 14a and 15a shown in FIGS. 14 and 15 are designed with the same linewidth, and here the linewidth is two microns, the same as that of FIG. 6 or 7.

The sequence of exposure for Zernike coefficient measurement will now be explained.

Like the embodiment described hereinbefore, the aperture shape 4b of the illumination aperture stop is determined in accordance with a Zernike coefficient just going to be obtained. By using this aperture shape 4b and in the state of a particular rotational position thereof, the marks 14a and 15a are transferred onto the wafer by exposure. Subsequently, the wafer state 12 is moved so that the marks 14a and 15b are superposed one upon another (or alternatively, this may be done by a reticle stage, not shown), again the marks 14a and 15b are exposed and transferred to the wafer by use of the same illumination aperture shape 4b, but with its rotational position changed. The two rotational positions of the illumination aperture stop 4 used here are based on a combination that follows the definition equations shown in FIG. 10. The procedure described above is repeated a number of times as defined in FIG. 10. Then, the amounts of relative positional deviations of plural marks 14a and 15a having been transferred with these processes are measured by using a measuring tool. On the basis of the thus obtained positional deviations, Zernike coefficients are calculated by calculation operations according to the definition equations given in FIG. 10.

The test patterns 14a and 15a may be provided at plural locations on one and the same reticle or on separate reticles. On that occasion, by performing exposures according to the procedure described above, measurement of aberration (Zernike coefficient) at different image heights is enabled.

It is a possible alternative that a light blocking pattern is provided on a surface of a reticle, closer to an illumination system than to the reticle pattern surface, to produce an optimum effective light source. Further, when the measurement results are fed back to the major assembly of the exposure apparatus, as shown in FIGS. 16 and 17, automatic correction of the aberration of a projection lens can be accomplished.

In accordance with the embodiments of the present invention described hereinbefore, an optimum effective light source shape and an optimum pattern causing small diffraction light are used in combination to provide an optimum pupil filter with respect to a particular Zernike term. With this arrangement, the Zernike coefficient itself can be measured with good precision. Advantageously, similar optimization is applicable to NA (numerical aperture) of projection lenses of various exposure apparatuses or various pattern sizes to be measured. Thus, high throughput and high precision measurement are attainable. Also, when feedback is applied to an aberration correcting system of an exposure apparatus, automatic correction or correction being optimized with respect to an actual device can be attained.

Next, an embodiment of a device manufacturing method, which uses a projection exposure apparatus such as described above, will be explained.

Figure 19:
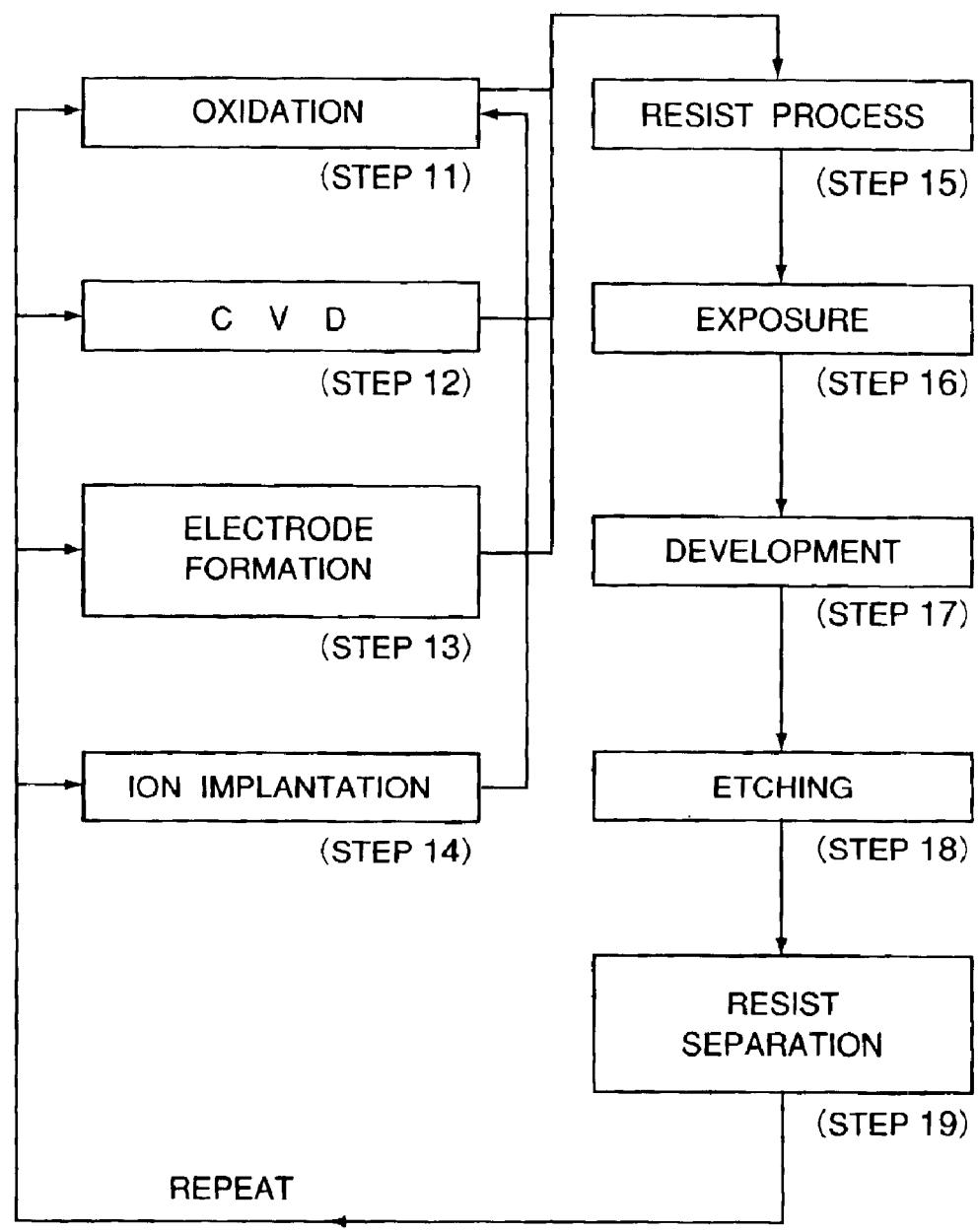
FIG. 19 is a flow chart of microdevice manufacturing processes.

FIG. 19 is a flow chart for explaining the procedure of manufacturing various microdevices such as semiconductor chips (e.g., ICs or LSIs), liquid crystal panels, CCDs, thin film magnetic heads or micromachines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

Figure 20:
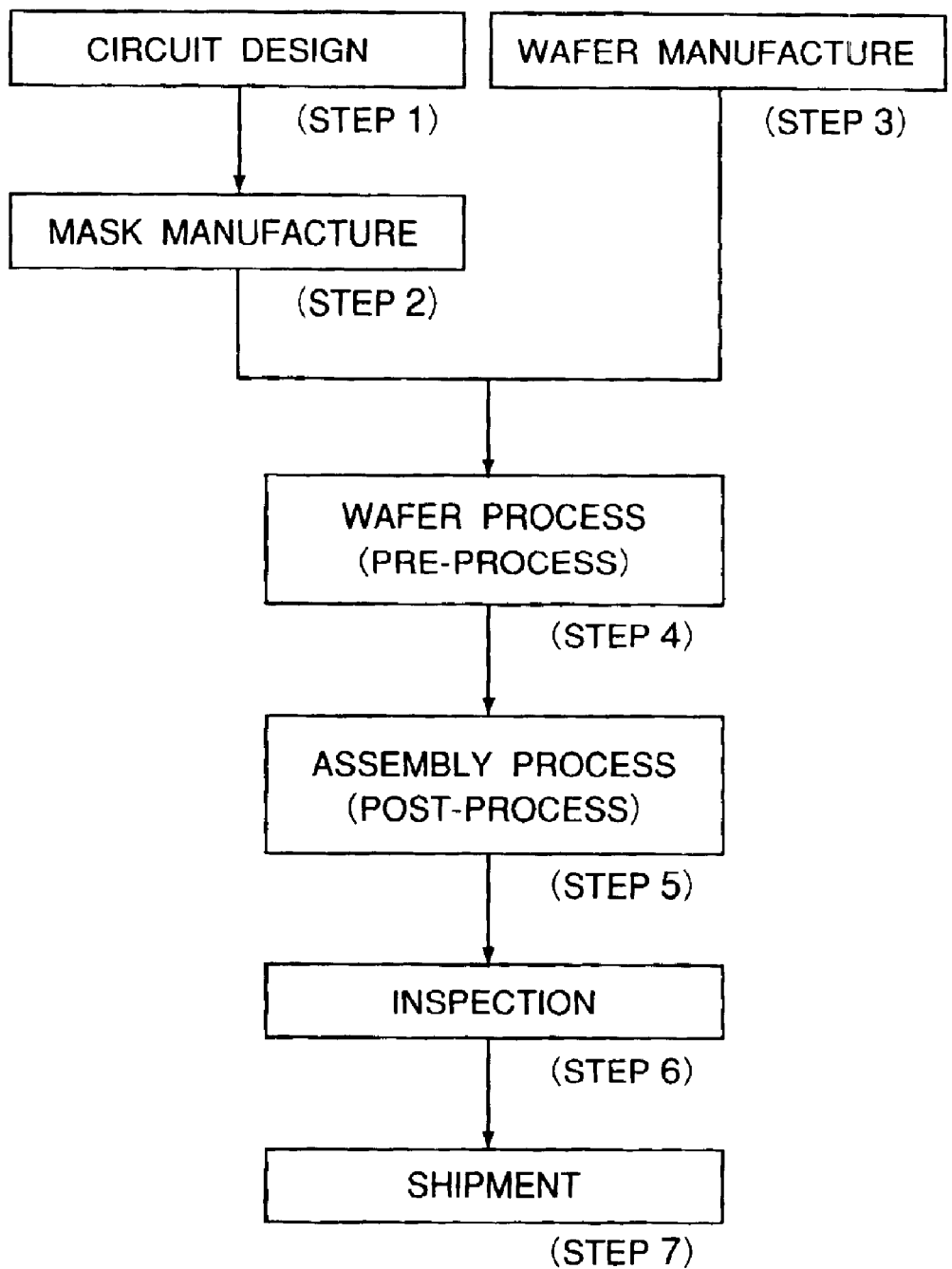
FIG. 20 is a flow chart for explaining details of a wafer process included in the procedure shown in FIG. 19.

FIG. 20 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of measuring aberration of a projection optical system, said method comprising the steps of:
    imaging a test pattern through the projection optical system; and
    measuring a positional deviation amount of the image of the test pattern; and
    determining a coefficient of a particular Zernike term of a wavefront of light which passes the projection optical system on the basis of the positional deviation amount, wherein said imaging step includes a process of restricting a position or a shape of a region on a pupil plane of the projection optical system in accordance with the particular Zernike term.

2. A method according to claim 1, wherein the region at the pupil of the projection optical system through which the light from the test pattern passes is restricted by a pupil plane filter in the projection optical system.

3. A method according to claim 1, wherein an illumination system for illuminating the test pattern has an effective light source of a predetermined shape, and wherein the test pattern comprises a pattern adapted so that mainly zeroth order diffraction light from that pattern passes through the pupil plane of the projection optical system while higher-order diffraction light from that pattern is substantially prevented from passing through the pupil plane, such that the region at the pupil of the projection optical system through which the light from the pattern passes is restricted.

4. A projection exposure apparatus having a mode for measuring aberration of a projection optical system in accordance with a measuring method as recited in claim 1.

5. A projection exposure apparatus having a mode for measuring aberration of a projection optical system in accordance with a measuring method as recited in claim 2.

6. A projection exposure apparatus having a mode for measuring aberration of a projection optical system in accordance with a measuring method as recited in claim 3.

7. A device manufacturing method comprising the steps of:

exposing a wafer with a device pattern by use of a projection exposure apparatus as recited in claim 4; and
   developing the exposed wafer.

8. A device manufacturing method comprising the steps of:

exposing a wafer with a device pattern by use of a projection exposure apparatus as recited in claim 5; and
   developing the exposed wafer.

9. A device manufacturing method comprising the steps of:

exposing a wafer with a device pattern by use of a projection exposure apparatus as recited in claim 6; and
   developing the exposed wafer.

* * * * *

UNITED STATES PATENT AND TRADEMARK OFFICE
CERTIFICATE OF CORRECTION

PATENT NO.       : 6,960,415 B2
APPLICATION NO.  : 10/260278
DATED            : November 1, 2005
INVENTOR(S)      : Yoshihiro Shiode It is certified that error appears in the above-identified patent and that said Letters Patent is hereby corrected as shown below:

ON THE TITLE PAGE:
    In item "(57)  ABSTRACT," line 4, "pattern" should read -- pattern, --.
    In item "(57)  ABSTRACT," line 5, "project" should read -- projection --.

IN THE DRAWINGS:
    In "SHEET 12 OF 27," "FIG. 9G," on the axis of the abscissa, "Zmk MODE" should read -- Zer MODE -- and on the label for the axis of the ordinate, "Zmk" should read -- Zer --.

COLUMN 1:
    Line 63, "$\sigma \leq 1$" should read -- $\sigma \geq 1$ --.

COLUMN 6:
    Line 29, "C34  1  9  0.2236  $126r^9 - 280r^7 + 210r^5$-    Cosθ comaX" should read -- C34  1  9  0.2236  $126r^9 - 280r^7 + 210r^5$    Cosθ Coma X --.
    Line 30, "C35  1  9  0.2236       Sinθ comaY" should read -- C35  1  9  0.2236    Sinθ ComaY --.
    Line 47, "$\bar{s} = Z \cdot \bar{c}$" should read -- $\bar{s} = Z \cdot \bar{c}$ --.
    Line 51, "Cj" should read -- $C_j$ --.
    Line 62, "$\bar{s}' = Z' \cdot \bar{c}'$" should rea -- $\bar{s}' = Z' \cdot \bar{c}'$ --.

COLUMN 7:
    Lines 20-22 "
$$\lambda_1 = \sum_k W_k \cdot Z_1(rk \cdot ' ek)$$
$$0 = \sum_k W_k \cdot Z_2(rk \cdot ' ek)$$
" should read --
$$\lambda_1 = \sum_k W_k \cdot Z_1(rk,' ek)$$
$$0 = \sum_k W_k \cdot Z_2(rk,' ek)$$
--.

COLUMN 8:
    Line 8, "$S1 = g \cdot Ci \cdot Zi(x1, y1)$" should read -- $S1 = g \cdot \Sigma C1 \cdot Zi(x1, y1)$ --.
    Line 20, "$= g\Sigma Ci \Sigma Wk \cdot Zi(Xk, yk)$ should read -- $= g\Sigma Ci \Sigma Wk \cdot Zi(xk, yk)$ --.

UNITED STATES PATENT AND TRADEMARK OFFICE
CERTIFICATE OF CORRECTION

PATENT NO. : 6,960,415 B2
APPLICATION NO. : 10/260278
DATED : November 1, 2005
INVENTOR(S) : Yoshihiro Shiode It is certified that error appears in the above-identified patent and that said Letters Patent is hereby corrected as shown below:

COLUMN 11:
  Line 5, "system 111" should read -- system 11 --.

COLUMN 12:
  Line 28, "4b-l" should read -- 4b-1 --.

COLUMN 13:
  Line 47, "As regard" should read -- In regards to --.

Signed and Sealed this

Twenty-sixth Day of September, 2006

JON W. DUDAS
*Director of the United States Patent and Trademark Office*